(12) United States Patent
Nomoto et al.

(10) Patent No.: US 8,258,514 B2
(45) Date of Patent: Sep. 4, 2012

(54) SEMICONDUCTOR DEVICE AND DISPLAY APPARATUS USING THE SEMICONDUCTOR DEVICE

(75) Inventors: Akihiro Nomoto, Kanagawa (JP); Hideki Ono, Tokyo (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 12/913,912

(22) Filed: Oct. 28, 2010

(65) Prior Publication Data

US 2011/0101358 A1    May 5, 2011

(30) Foreign Application Priority Data

Nov. 5, 2009 (JP) .................. 2009-254088

(51) Int. Cl.
*H01L 33/16* (2010.01)

(52) U.S. Cl. ..... 257/59; 257/40; 257/347; 257/E33.053; 257/E27.112

(58) Field of Classification Search ............. 257/40, 257/59, 347, E33.053, E27.112
See application file for complete search history.

(56) References Cited

FOREIGN PATENT DOCUMENTS

JP    2008-085200    4/2008

*Primary Examiner* — Long Pham
(74) *Attorney, Agent, or Firm* — SNR Denton US LLP

(57) ABSTRACT

Disclosed herein is a semiconductor device which employs a thin-film transistor. In addition, the semiconductor device has a gate electrode, a gate insulation film, an organic semiconductor layer, a structure, a source electrode, a drain electrode, and an electrode material layer.

10 Claims, 9 Drawing Sheets

SEMICONDUCTOR DEVICE AND DISPLAY APPARATUS USING THE SEMICONDUCTOR DEVICE

BACKGROUND OF THE INVENTION

1. Field of the Invention

The present invention relates to a semiconductor device and a display apparatus which makes use of the semiconductor device.

2. Description of the Related Art

In recent years, the so-called organic TFT (thin-film transistor) draws much attention. The organic TFT is a TFT which makes use of an organic semiconductor as a channel layer.

In the case of the organic TFT, a channel layer made from an organic semiconductor can be created at a low temperature by carrying out a coating process. Thus, the organic TFT is advantageous for reduction of the cost and, in addition, the organic TFT can be created on a flexible substrate which does not exhibit a heat-resistance property. A typical example of the flexible substrate not exhibiting a heat-resistance property is a plastic material.

By designing such an organic TFT into a top-contact/bottom-gate structure, as is commonly known, characteristic deteriorations caused by stresses such as thermal stresses can be avoided in comparison with a TFT having the bottom-contact structure.

For an organic TFT having a top-contact/bottom-gate structure, there has been studied a pattern creation method for creating a source electrode and a drain electrode on an organic semiconductor pattern with a high degree of precision.

For example, there has been disclosed a method whereby, after a sacrifice layer and a resist layer have been created on an organic semiconductor layer as patterns other than electrodes, the electrode material is completely piled up and the sacrifice layer is dissolved in order to lift off the electrode material on the resist layer. For more information on the disclosed method, the reader is advised to refer to Japanese Patent Laid-open No. 2008-85200.

In accordance with the disclosed method, an electrode can be created with a high degree of efficiency by carrying out a patterning process on a resist.

SUMMARY OF THE INVENTION

In accordance with the method described in Japanese Patent Laid-open No. 2008-85200, however, a film peeled off at the lift-off time is again attached, lowering the manufacturing yield.

In addition, in an etch stop structure used in typically a TFT made from an amorphous silicon material, it is necessary to adjust the positions of the source and drain electrodes on an etch stop layer. Thus, a big design margin is required.

In such an etch stop structure, the width of the etch stop layer is equal to a channel length Lch. Thus, if a big design margin is set, the channel length Lch increases. In particular, if a substrate having a large size or a plastic substrate having a large expansion/contraction ratio is used, it is difficult to adjust the positions of the source and drain electrodes on the etch stop layer. Thus, an even bigger design margin is required.

In addition, in a typical application of making use of an organic TFT on the backplane of a display section for example, increasing the design margin necessitates a larger pixel size if a position alignment margin is to be taken into consideration. If the pixel size is large, it is undesirably difficult to increase the number of pixels.

In order to solve the problems described above, inventors of the present invention have provided a semiconductor device and a display apparatus which employs the semiconductor device. The semiconductor device according to the present invention allows electrodes to be created with a high degree of precision and a design margin to be reduced.

The semiconductor device according to the present invention is a semiconductor device which employs a thin-film transistor. In addition, the semiconductor device has a gate electrode of the thin-film transistor, a gate insulation film created to cover the gate electrode and an organic semiconductor layer created on the gate insulation film to serve as a layer including source, channel and drain areas of the thin-film transistor. On top of that, the semiconductor device also includes a structure created on the organic semiconductor layer, a source electrode of the thin-film transistor, a drain electrode of the thin-film transistor and an electrode material layer created on the structure from the same material as the source and drain electrodes. The source electrode is an electrode created to start from a specific upper surface of the gate insulation film and end at a specific upper surface of the organic semiconductor layer. By the same token, the drain electrode is an electrode created to start from another upper surface of the gate insulation film and end at another upper surface of the organic semiconductor layer. Each of the specific and other upper surfaces of the organic semiconductor layer is a surface outside the structure.

A display apparatus according to the present invention employs a semiconductor device, a backplane including a semiconductor device and a display panel for displaying an image. The semiconductor device included in the backplane has a configuration identical with the configuration of the semiconductor device according to the present invention.

In accordance with the configuration of the semiconductor device provided by the present invention as described above, the semiconductor device employs:

the structure created on the organic semiconductor layer;

the source electrode created to start from a specific upper surface of the gate insulation film and end at a specific upper surface provided outside the structure to serve as an upper surface of the organic semiconductor layer electrode to serve as the source electrode of the thin-film transistor;

the drain electrode created to start from another upper surface of the gate insulation film and end at another upper surface provided outside the structure to serve as an upper surface of the organic semiconductor layer electrode to serve as the drain electrode of the thin-film transistor; and the electrode material layer created on the structure from the same material as the source and drain electrodes.

Thus, the inner end of the source electrode can be created at a position aligned to the outer edge of the structure or at a position close to the position aligned to the outer edge of the structure. By the same token, the inner end of the drain electrode can be created at a position aligned to the outer edge of the structure or at a position close to the position aligned to the outer edge of the structure. In addition, the channel length matches the patterning resolution of the structure or approximately approaches the patterning resolution of the structure. As a result, the channel length can be so set that the channel length is not affected by the position alignment precision.

The display apparatus according to the present invention is configured to employ a semiconductor device, a backplane including the semiconductor device having a configuration identical with the configuration of the semiconductor device provided by the present invention as described above and a display panel for displaying an image. It is thus possible to avoid the channel length of the semiconductor device from being affected by the precision of the alignment of positions.

In accordance with the display apparatus provided by the present invention as described above, it is possible to avoid the channel length of the apparatus semiconductor device from being affected by the precision of the alignment of positions. It is thus no longer necessary to increase the design margin.

In addition, the source and drain electrodes can be created by self alignment of the positions of the source and drain electrodes to the position of the structure even if the substrate and/or other sections expand after the structure has been created.

In accordance with the display apparatus provided by the present invention as described above, the channel length of the semiconductor device employed in the display apparatus can be so set that the channel length is not affected by the precision of the alignment of positions. It is thus no longer necessary to increase the design margin. In addition, the source and drain electrodes employed in the semiconductor device can be created by self alignment of the positions of the source and drain electrodes to the position of the structure even if the substrate employed in the semiconductor device and other elements employed in the semiconductor device expand after the structure has been created.

Thus, the semiconductor device employed in the display apparatus can be created with a high degree of precision to serve as a device having a channel length determined in advance. As a result, it is possible to enhance the performance of the display apparatus employing the semiconductor device and to increase the manufacturing yield of the semiconductor device.

In addition, it is also possible to reduce the design margin of the semiconductor device and decrease the size of the semiconductor device so that the number of pixels each employed in the display apparatus to serve as a pixel including the semiconductor device can be increased.

DETAILED DESCRIPTION OF THE PREFERRED EMBODIMENTS

Preferred embodiments of the present invention are explained below by referring to diagrams. In the following description, each of the preferred embodiments is also referred to simply as an embodiment.

It is to be noted that the preferred embodiments are explained in chapters which are arranged in the following order.

1: First Embodiment of the Semiconductor Device
2: Second Embodiment of the Semiconductor Device
3: Third Embodiment of the Semiconductor Device
4: Fourth Embodiment of the Semiconductor Device
5: Fifth Embodiment of the Semiconductor Device
6: Sixth Embodiment of the Semiconductor Device
7: Embodiment of the Display Apparatus According to the Invention 1: First Embodiment of the Semiconductor Device FIG. 1 is a cross-sectional diagram serving as a configuration diagram showing a rough configuration including necessary components employed in a semiconductor device according to a first embodiment of the present invention.

Figure 1:
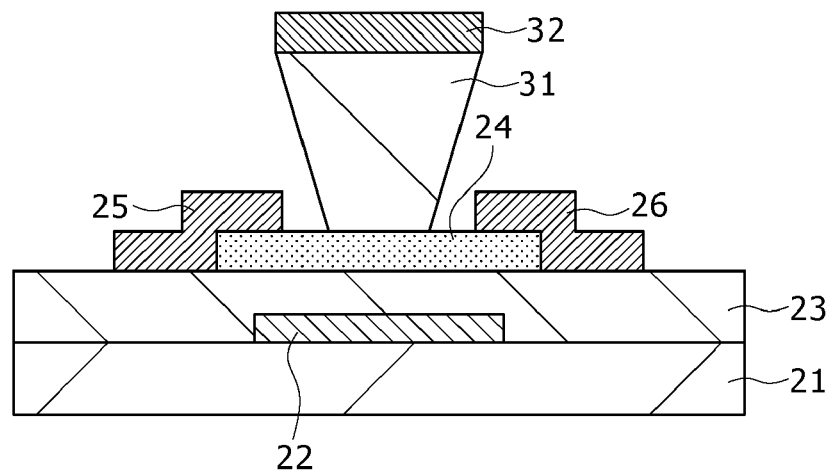
FIG. 1 is a cross-sectional diagram serving as a configuration diagram showing a rough configuration including necessary components employed in a semiconductor device according to a first embodiment of the present invention.

As shown in the cross-sectional diagram of FIG. 1, the semiconductor device is configured to include an organic TFT (thin-film transistor) based on an organic semiconductor layer 24.

The semiconductor device is created as follows. First of all, the gate electrode 22 of the organic TFT is created on a substrate 21 and, then, a gate insulation layer 23 created as a gate insulation film is provided to cover the gate electrode 22.

Subsequently, an organic semiconductor layer 24 configured to include source, channel and drain areas of the organic TFT is created on the gate insulation layer 23 which has been created as a gate insulation film.

Then, a source electrode 25 of the organic TFT and a drain electrode 26 of the organic TFT are created to cover respectively left and right ends of the organic semiconductor layer 24.

The gate electrode 22 can be created from a metallic material such as Cu.

The gate insulation layer 23 implemented as a gate insulation film can be made from an organic material which can be hardened after being created on the substrate 21 to serve as a coat covering the gate electrode 22.

The organic semiconductor layer 24 can be created from an organic semiconductor material such as the pentacene and the TIPS (Triisopropylsilylethynyl) pentacene.

Each of the source electrode 25 and the drain electrode 26 can be typically created from Ag, Au, Pt, Pd, Cu, Ni or a conductive organic material. Typical examples of the conductive organic material are the poly (3,4-ethylene dioxythiophene)/poly(4-styrenesulfonate) [PEDOT/PSS] and the PANI (poly-aniline).

In this embodiment, a structure 31 having an upside-down taper shape is then created on the organic semiconductor layer 24 which has been created between the source electrode 25 and the drain electrode 26.

On the structure 31, an electrode material layer 32 is created from the same material as the source electrode 25 and the drain electrode 26.

The source electrode 25 and the drain electrode 26 are created by adjusting the positions of the inner ends of the source electrode 25 and the drain electrode 26 to the outer edges of the structure 31 and the outer edges of the electrode material layer 32 created on the structure 31. That is to say, the source electrode 25 and the drain electrode 26 are so created that, when seen from a position above the source electrode 25 and the drain electrode 26, the inner ends of the source electrode 25 and the drain electrode 26 are created at all but the same positions as the outer edges of the structure 31 and the outer edges of the electrode material layer 32 created on the structure 31.

The structure 31 having an upside-down taper shape can be created from an insulation material such as a resist material.

By constructing the semiconductor device according to the first embodiment into such a structure, the source electrode 25 and the drain electrode 26 can be created with a high degree of precision and, in addition, the design margin can thus be reduced.

Figure 2:
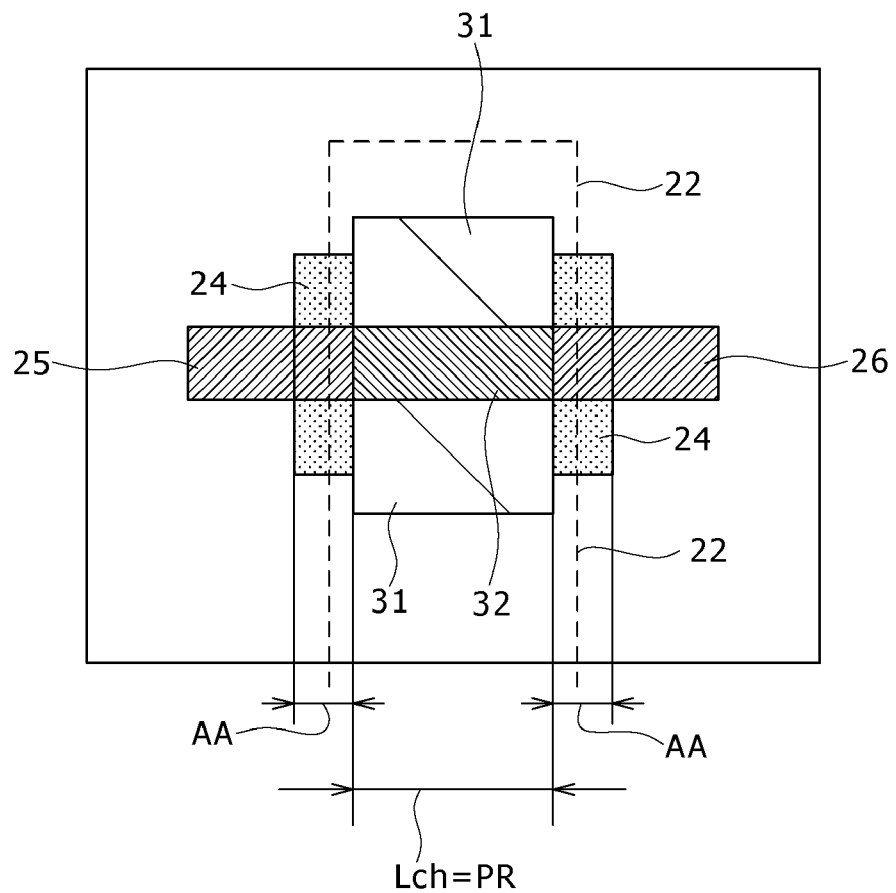
FIG. 2 is a top-view diagram serving as a configuration diagram showing a rough configuration including necessary components employed in the semiconductor device shown in the cross-sectional diagram of FIG. 1.

FIG. 2 is a top-view diagram serving as a configuration diagram showing the semiconductor device shown in the cross-sectional diagram of FIG. 1. In addition, for the purpose of comparison, FIG. 13 is given as a plurality of diagrams showing a semiconductor device having the existing etch stop structure. To be more specific, FIG. 13A is a cross-sectional diagram showing the existing semiconductor device whereas FIG. 13B is a top-view diagram showing the existing semiconductor device.

Figure 13A:
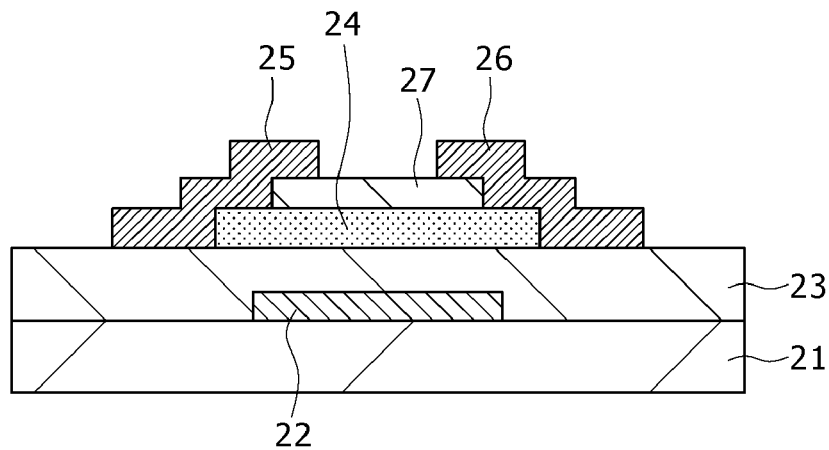
FIG. 13A is a cross-sectional diagram showing the existing semiconductor device.
Figure 13B:
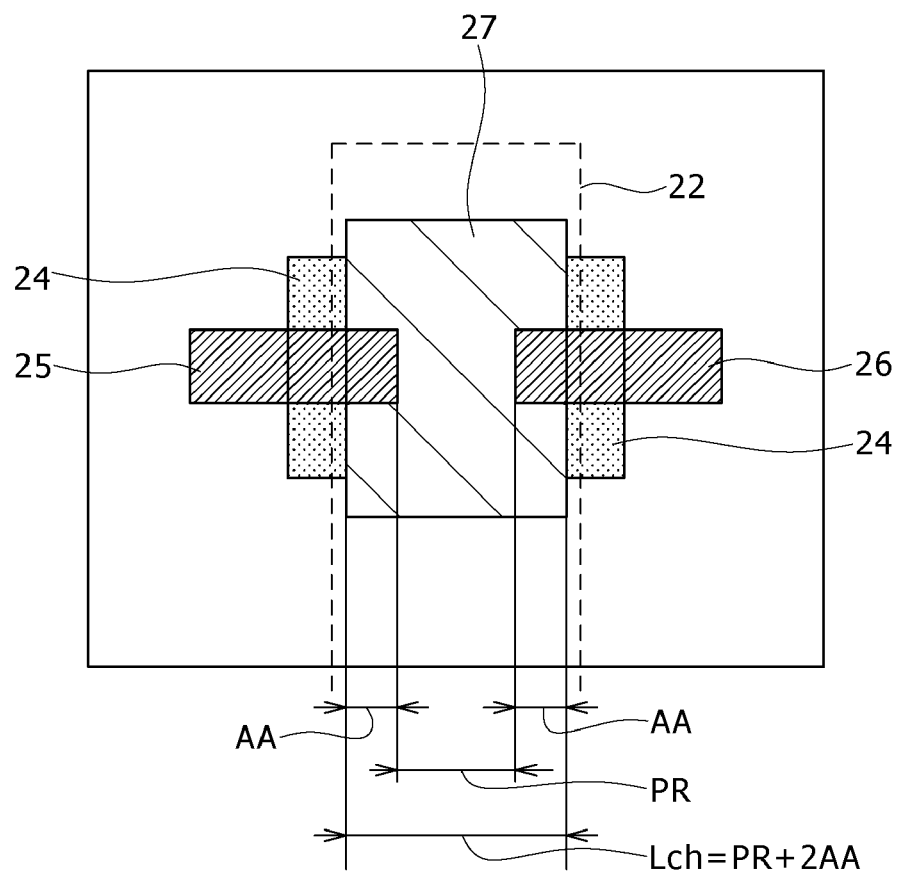
FIG. 13B is a top-view diagram showing the existing semiconductor device.

It is to be noted that some hatched blocks shown in the top-view diagrams of FIGS. 2 and 13B are provided with the same hatching types as their respective hatch blocks shown in the cross-sectional diagram of FIG. 13A in order to make locations seen from a position above the semiconductor device as the locations of the layers easy to understand. In addition, the gate electrode 22 hidden behind the gate insulation layer 23 as shown in the cross-sectional diagram of FIG. 13A is shown as a block enclosed by a dashed line in the top-view diagram of FIG. 13B.

In the case of the existing etch stop structure, an insulation layer 27 implemented as an etch stop layer is created on the organic semiconductor layer 24 as shown in the cross-sectional diagram of FIG. 13A. In this existing etch stop structure, the source electrode 25 is extended to the upper surface of the left end of the insulation layer 27 whereas the drain electrode 26 is extended to the upper surface of the right end of the insulation layer 27.

In the case of this existing etch stop structure, as shown in the top-view diagram of FIG. 13B, the position alignment precision AA is the distance between the outer edge of the insulation layer 27 and the inner end of the source electrode 25 or the inner end of the drain electrode 26. The distance between the inner end of the source electrode 25 and the inner end of the drain electrode 26 matches a patterning resolution PR.

In this existing etch stop structure, the channel length Lch matches the width of the insulation layer 27. Thus, the channel length Lch is the sum of the patterning resolution PR and twice the position alignment precision AA. If the design margin is increased, it is necessary to raise the position alignment precision AA. Thus, the channel length Lch undesirably increases.

In the case of the semiconductor device according to the first embodiment, on the other hand, the position alignment precision AA is the distance between the outer edge of the organic semiconductor layer 24 and the outer edge of the structure 31 as shown in the top-view diagram of FIG. 2. In addition, the patterning resolution PR is the width of the structure 31. In the case of the semiconductor device according to the first embodiment, the channel length Lch is the distance between the inner ends of the two electrodes, i.e., the source electrode 25 and the drain electrode 26. In addition, since alignment is carried out in the vertical direction on the position of a specific outer edge of the structure 31 and the inner end of the source electrode 25 as well as the position of the other outer edge of the structure 31 and the inner end of the drain electrode 26, the width of the structure 31 matches the distance between the inner ends of the source electrode 25 and the drain electrode 26.

Thus, in the case of the semiconductor device according to the first embodiment, the channel length Lch matches the width of the structure 31. That is to say, the channel length Lch matches the patterning resolution PR. Thus, since the channel length Lch can be set without regard to the position alignment precision AA, it is not necessary to set the design margin at a large value.

For example, the semiconductor device according to the embodiment can be manufactured as described as follows.

First of all, a gate electrode 22 and a gate insulation layer 23 implemented as a gate insulation film are created on a substrate 21. The creation method and the materials used for making the gate electrode 22 and the gate insulation layer 23 are by no means limited to respectively methods cited in the following description and materials also mentioned in the following description.

The method for creating the gate electrode 22 is typically the sputtering method. In accordance with the sputtering method, the gate electrode 22 is first created as a film with a thickness of 30 nm. A patterning process is then carried out by adoption of the lithography and etching technologies in order to form a predetermined pattern of the gate electrode 22.

Then, the gate insulation layer 23 is created by applying a mixture material to the substrate 21 and gate electrode 22 by adoption of the spin coat method in a burning process. The mixture material is a material obtained by mixing typically the PVP (poly vinyl phenol) with a hardening agent such as the melamine resin.

Figure 3A:
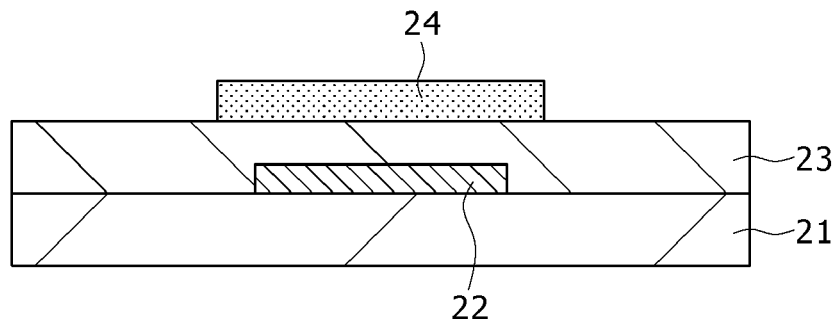
FIGS. 3A to 3C are cross-sectional diagrams serving as manufacturing process diagrams depicting a method for manufacturing the semiconductor device shown in the cross-sectional diagram of FIG. 1.

Then, as shown in a FIG. 3A which is a cross-sectional diagram showing an initial stage of the method for manufacturing the semiconductor device, an organic semiconductor layer 24 having a pattern determined in advance is created on the gate insulation layer 23. By the way, FIGS. 3A and 3B are cross-sectional diagrams serving as manufacturing process diagrams depicting a method for manufacturing the semiconductor device shown in the cross-sectional diagram of FIG. 1.

For example, the organic semiconductor layer 24 can be created from a material such as the pentacene or the TIPS (Triisopropylsilylehynyl) pentacene. The method for creating the organic semiconductor layer 24 is not prescribed in particular. Typical examples of the method for creating the organic semiconductor layer 24 are a coat method, a vacuum vapor-deposition method and a printing method. Typical examples of the coat method are the spin coat method cited above, a cap coat method and a dip coat method whereas a typical example of the printing method is an ink jet method.

The method for patterning the organic semiconductor layer 24 is not prescribed in particular. That is to say, any commonly known method for patterning the organic semiconductor layer 24 can be used. For example, in accordance with a typical patterning method, an etching process is carried out after the entire film for the organic semiconductor layer 24 is created. In accordance with another typical patterning method, a shadow mask is used to create a partial film, or a hydrophobic water repellent surface is created in advance in order to repel semiconductor ink.

Figure 3B:
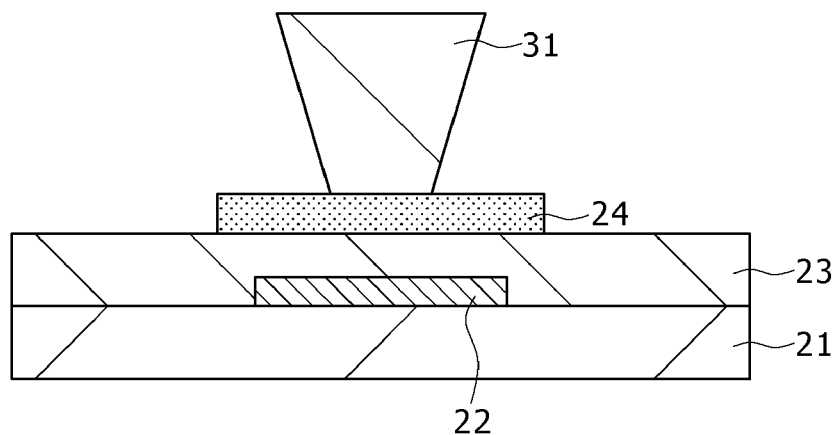
Figure 3C:
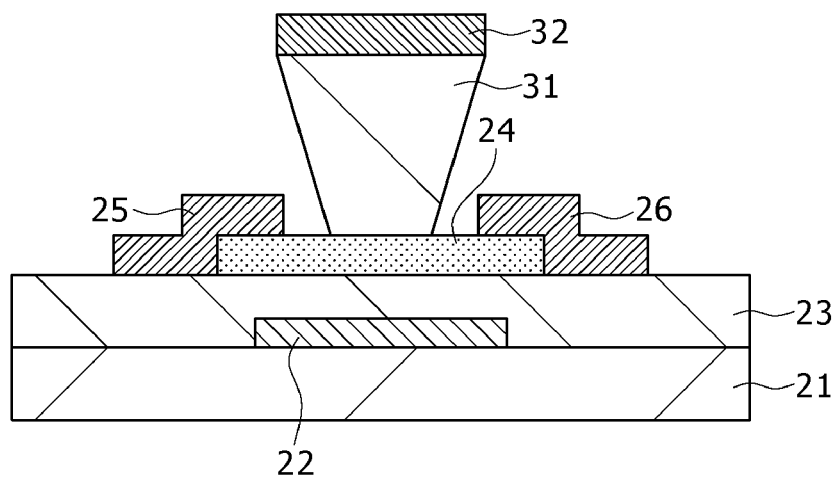

Then, a structure 31 having an upside-down taper shape is created on the organic semiconductor layer 24 as shown in FIG. 3B, which is a cross-sectional diagram showing an intermediate stage of the method for manufacturing the semiconductor device.

Typically, the structure 31 is created by adoption of a photography technology making use of a photo-resist material which allows the upside-down taper shape to be made. A typical example of the photo-resist material allowing the upside-down taper shape to be made is the AZ5214 which is made by AZ Materials Corporation.

In addition, the structure 31 having an upside-down taper shape can also be created by transferring a structural object which has been made to have the upside-down taper shape by adoption of a transfer printing method such as a gravure printing method or a dry resist lamination method.

Then, an electrode material is created as a film on the upper surface of the structure 31. In this process of creating the electrode material film on the upper surface of the structure 31, the outer edges of the structure 31 cut the electrode material, producing a source electrode 25 over a specific end of the organic semiconductor layer 24 and a drain electrode 26 over the other end of the organic semiconductor layer 24 as shown in FIG. 3B, which is a cross-sectional diagram showing a last stage of the method for manufacturing the semiconductor device. In addition, an electrode material layer 32 is left on the upper surface of the structure 31. When the outer edges of the structure 31 cut the electrode material, the location of the inner end of the source electrode 25 and the location of the inner end of the drain electrode 26 are self aligned to the locations of their respective outer edges of the structure 31. Thus, the source electrode 25 is created so that, when viewed from a position above the semiconductor device, the location of the inner end of the source electrode 25 all but coincides with the location of a specific outer edge of the structure 31. By the same token, the drain electrode 26 is created so that, when viewed from a position above the semiconductor device, the location of the inner end of the drain electrode 26 all but coincides with the location of the other outer edge of the structure 31.

In addition, by adoption of a thin-film transfer method such as a gravure offset method or an inversion offset printing method, it is also possible to create an electrode material on the upper surface of the structure 31 as a film and to have the outer edges of the structure 31 cut the electrode material, resulting in a source electrode 25 and a drain electrode 26 like the source electrode 25 and the drain electrode 26 which have been described above.

It is to be noted that a patterning process to make wires of sections other than the structure 31 can be carried out by adoption of a commonly known patterning method. In a process of creating a film by adoption of the vacuum vapor-deposition method for example, a rough patterning process can be carried out by making use of a shadow mask. In addition, after a wiring layer has been created over an entire surface, a resist pattern is created by adoption of the lithography technology prior to the execution of an etching process. In this way, a wiring pattern can be made.

In accordance with the configuration according to the first embodiment described above, the structure 31 having an upside-down taper shape is created on the organic semiconductor layer 24. Then, the source electrode 25 and the drain electrode 26 are created by adjusting the position of the inner end of the source electrode 25 to the position of a specific outer edge of the structure 31 and adjusting the position of the inner end of the drain electrode 26 to the position of the other outer edge of the structure 31. By adjusting the position of the inner end of the source electrode 25 to the position of a specific outer edge of the structure 31 and adjusting the position of the inner end of the drain electrode 26 to the position of the other outer edge of the structure 31, the channel length Lch matches the patterning resolution PR of the structure 31 and is not affected by the precision AA of the position alignment. Thus, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure 31 even if the substrate 21 expands and/or another phenomenon occurs after the structure 31 has been created.

It is to be noted that, depending on the method for creating the electrode material layer 32, there may be a change of the state in which the position of the inner end of the source electrode 25 has been aligned to the position of a specific outer edge of the structure 31 and the position of the inner end of the drain electrode 26 has been aligned to the position of the other outer edge of the structure 31. Thus, in some cases, the position of the inner end of the source electrode 25 and/or the position of the inner end of the drain electrode 26 are shifted slightly in a direction toward the inner or outer side.

In such cases, the channel length Lch differs from the patterning resolution PR of the structure 31. However, there is almost no effect of the position alignment precision AA on the channel length Lch. Thus, as is the case with the configuration according to the first embodiment, without taking a large design margin, the channel length Lch can be created with a high degree of precision.

Figure 4:
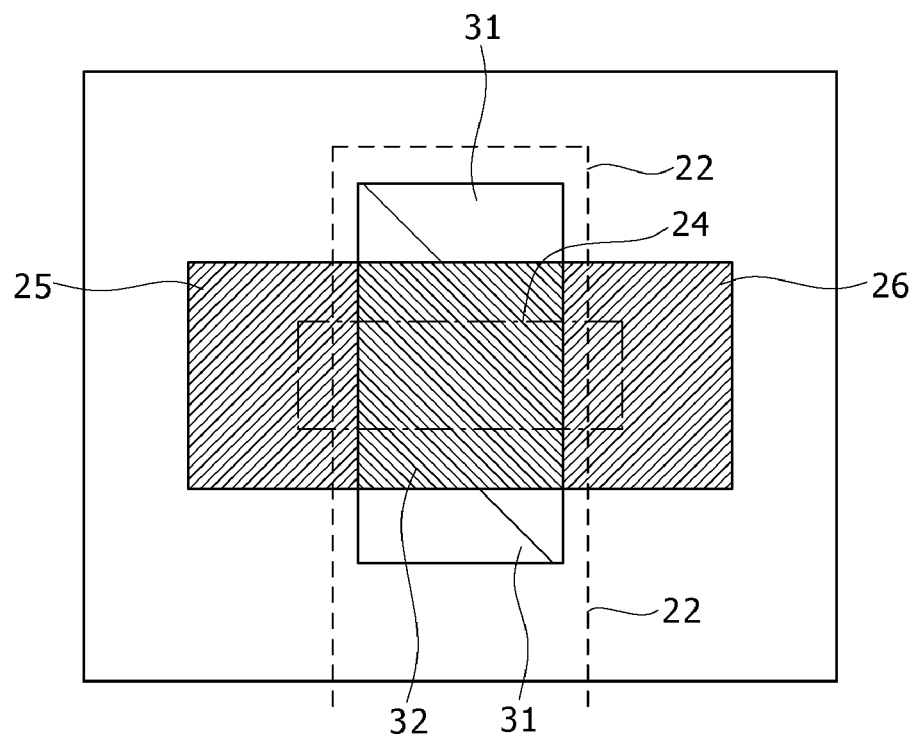
FIG. 4 is a top-view diagram serving as a rough configuration diagram showing necessary sections employed in a semiconductor device according to a modified version of the first embodiment of the present invention.

Next, a modified version of the first embodiment implementing the semiconductor device according to the present invention is explained by referring to FIG. 4 which is a top-view diagram serving as a rough configuration diagram showing necessary sections employed in the semiconductor device.

As shown in the top-view diagram of FIG. 4, the width of the electrode material layer 32 is made greater than the width of the organic semiconductor layer 24 so that the organic semiconductor layer 24 having its outer edges each shown by a dashed line is all covered by the structure 31, the source electrode 25 and the drain electrode 26.

The channel length Lch in the modified version of the first embodiment is equal to the channel length Lch in the first embodiment. However, the channel width in the modified version of the first embodiment is equal to the width of the organic semiconductor layer 24 whereas the channel width in the first embodiment is equal to the sum of the widths of the source electrode 25 and the drain electrode 26.

As described above, in the case of the modified version of the first embodiment, the organic semiconductor layer 24 is all covered by the structure 31, the source electrode 25 and the drain electrode 26. Thus, the modified version of the first embodiment has a merit that the organic semiconductor layer 24 can be protected from being damaged.

In the first embodiment described above, the structure 31 is created to have such an upside-down taper shape that each of the side surfaces thereof is an inclined surface. However, the scope of the present invention is by no means limited to this configuration in which the structure 31 is created to have such an upside-down taper shape that each of the side surfaces thereof is an inclined surface. That is to say, the structure 31 can be created to have another shape. For example, each of the side surfaces of the structure 31 is not an inclined surface, but a surface perpendicular to the surface of the substrate 21. As another example, each of the side surfaces of the structure 31 is an inclined surface, but the area of the cross section on the substrate side is large. That is to say, in the case of this other example, the structure 31 is created to have a regular upright taper shape. As a further example, the structure 31 is created to have an over hung shape other than the upside-down taper shape described so far. The over hung shape is a shape that also has a large surface on the side close to the electrode material layer 32 in comparison with the surface on the side close to the organic semiconductor layer 24.

The following description explains a second embodiment implementing a semiconductor device including a structure which has the over hung shape other than the upside-down taper shape.

2: Second Embodiment of the Semiconductor Device

Figure 5:
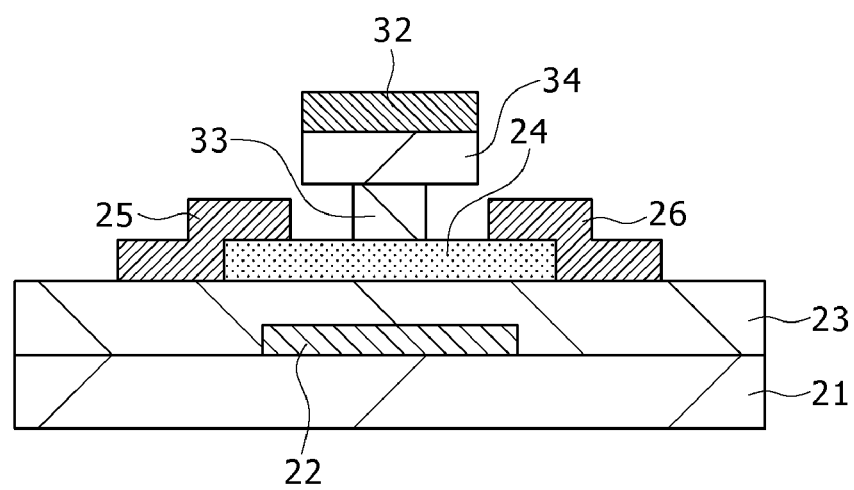
FIG. 5 is a cross-sectional diagram serving as a configuration diagram showing a rough configuration including necessary components employed in a semiconductor device according to a second embodiment of the present invention.

FIG. 5 is a cross-sectional diagram serving as a configuration diagram showing a rough configuration including necessary components employed in a semiconductor device according to a second embodiment of the present invention.

In the case of the second embodiment, a structure having the over hung shape other than the upside-down taper shape is created as a stack which composes of a lower insulation layer 33 serving as a structure lower-side layer having a small width and an upper insulation layer 34 serving as a structure upper-side layer having a large width as shown in the cross-sectional diagram of FIG. 5.

Since the other configurations included in the second embodiment are identical with their respective counterpart configurations included in the first embodiment, the other configurations are denoted by the same reference numerals as the counterpart configurations and the other configurations are not described in order to avoid duplications of explanations.

The lower insulation layer 33 serving as the lower-side layer of the structure can be made from the same material as the upper insulation layer 34 which serves as the upper-side layer of the structure. As an alternative, the lower insulation layer 33 serving as the lower-side layer of the structure can also be made from a material different from the material of the upper insulation layer 34 which serves as the upper-side layer of the structure.

For example, the photo resist LOL is used as the lower insulation layer 33 serving as the lower-side layer of the structure whereas the AZ1500 positive resist is used as the upper insulation layer 34 which serves as the upper-side layer of the structure. Since the photo resist LOL has an exposure characteristic different from that of the AZ1500 positive resist, the width of the lower insulation layer 33 serving as the lower-side layer of the structure can be made different from the width of the upper insulation layer 34 serving as the upper-side layer of the structure by utilizing the difference in exposure characteristic between the lower insulation layer 33 and the upper insulation layer 34.

In the case of the second embodiment, it is not necessary to create a single structure which has an upside-down taper shape. Thus, in comparison with the first embodiment, the materials used for making the lower insulation layer 33 and the upper insulation layer 34 can be selected from a great variety of available materials.

The structure according to the second embodiment can be created typically as described below.

The photo resist LOL mentioned above is applied to the organic semiconductor layer 24, which has already been created above the substrate 21 as shown in the cross-sectional diagram of FIG. 3A, in order to create the lower insulation layer 33 serving as the lower-side layer of the structure.

Then, the AZ1500 positive resist cited above is applied to the lower insulation layer 33 in order to create the upper insulation layer 34 serving as the upper-side layer of the structure as shown in the cross-sectional diagram of FIG. 5.

Subsequently, an exposure process is carried out. Due to the exposure process, the photo resist LOL used for creating the lower insulation layer 33 serving as the lower-side layer of the structure is dissolved slightly to the inner side in comparison with the AZ1500 positive resist used for creating the upper insulation layer 34 serving as the upper-side layer of the structure. As a result, a structure is created to have such an over hung shape that the lower insulation layer 33 serving as the lower-side layer of the structure has wall surfaces on sides inner with respect to the wall surfaces of the upper insulation layer 34 serving as the upper-side layer of the structure as shown in the cross-sectional diagram of FIG. 5.

It is to be noted that, in the method for creating the structure composed of the lower insulation layer 33 and the upper insulation layer 34, a permanent resist or the like can also be used as a material for creating the structure. The permanent resist is a resist which is not solved in a solvent in a cross-linking process carried out by making use of heat and/or light.

After the structure having an over hung shape has been created as described above, an electrode material is created on the upper insulation layer 34 serving as the upper-side layer of the structure to be cut by the outer edges of the upper insulation layer 34 to result in the source electrode 25 and the drain electrode 26 by aligning the positions of the inner ends of the source electrode 25 and the drain electrode 26 to the positions of their respective outer edges of the upper insulation layer 34 in the same way as the first embodiment.

In addition, the structure according to the second embodiment can be created by adoption of another manufacturing method.

In accordance with this other manufacturing method, in place of the photo resist LOL, an insulation film is applied to the entire surface of the organic semiconductor layer 24, which has already been created above the substrate 21 as shown in the cross-sectional diagram of FIG. 3A, in order to create the lower insulation layer 33 serving as the lower-side layer of the structure in a burning process. In this other manufacturing method, the insulation film is a film which can be solved in a water or fluorine series solvent. A typical example of the insulation film is the PVA (poly vinyl alcohol) film which can be solved in a water solvent.

Then, an SU-8 resist is applied to the insulation film in order to create the upper insulation layer 34 serving as the upper-side layer of the structure in an exposure process.

Subsequently, the insulation film is dissolved in order to create a structure which has such an over hung shape that the lower insulation layer 33 serving as the lower-side layer of the structure has wall surfaces on sides inner with respect to the wall surfaces of the upper insulation layer 34 serving as the upper-side layer of the structure as shown in the cross-sectional diagram of FIG. 5. In this case, the lower insulation layer 33 created as the lower-side layer of the structure functions as a film for protecting the organic semiconductor layer 24.

If the structure is created in accordance with this other manufacturing method as described above, the use of the water or fluorine series solvent does not cause the organic semiconductor layer 24 to deteriorate so that the lower insulation layer 33 created as the lower-side layer of the structure functions as a film for protecting the organic semiconductor layer 24.

In accordance with the second embodiment described above, a structure having the over hung shape other than the upside-down taper shape is created as a stack of two layers on the organic semiconductor layer 24 which has already been created above the substrate 21 as shown in the cross-sectional diagram of FIG. 3A. The two layers of the stack are a lower insulation layer 33 serving as the structure lower-side layer having a small width and an upper insulation layer 34 serving as the structure upper-side layer having a large width. Then, an electrode material is created on the upper insulation layer 34 serving as the upper-side layer of the structure to be cut by the outer edges of the upper insulation layer 34 to result in the source electrode 25 and the drain electrode 26 by aligning the positions of the inner ends of the source electrode 25 and the drain electrode 26 to the positions of their respective outer edges of the upper insulation layer 34.

Thus, much like the first embodiment described previously, the channel length Lch matches the patterning resolution PR of the structure. As a result, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure even if the substrate 21 expands and/or another phenomenon occurs after the structure has been created.

3: Third Embodiment of the Semiconductor Device

Figure 6:
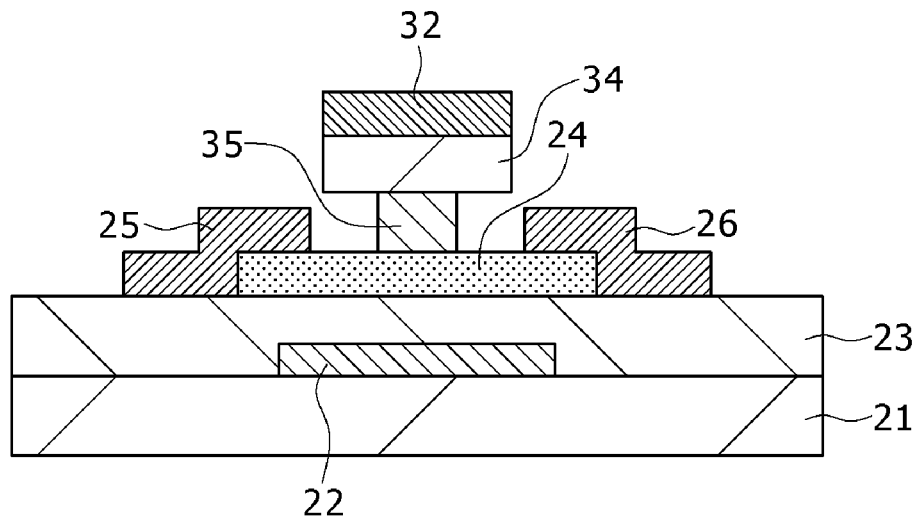
FIG. 6 is a cross-sectional diagram serving as a configuration diagram showing a rough configuration including necessary components employed in a semiconductor device according to a third embodiment of the present invention.

FIG. 6 is a cross-sectional diagram serving as a configuration diagram showing a rough configuration including necessary components employed in a semiconductor device according to a third embodiment of the present invention.

In the case of the third embodiment, in place of the lower insulation layer 33 of the structure included in the second embodiment to serve as a structure lower-side layer with a relatively small width, a metallic or semiconductor layer 35 is created to serve as a structure lower-side layer with a relatively small width. The upper insulation layer 34 serve as a structure upper-side layer with a relatively small width is created on the metallic or semiconductor layer 35 in order in order to form a stack serving as a structure having an over hung shape which composes of the upper insulation layer 34 and the metallic or semiconductor layer 35.

Since the other configurations included in the third embodiment are identical with their respective counterpart configurations included in the second embodiment, the other configurations are denoted by the same reference numerals as the counterpart configurations and the other configurations are not described in order to avoid duplications of explanations.

The metallic or semiconductor layer 35 can be made from a metal such as Al or a semiconductor such as silicon.

The structure according to the third embodiment can be created typically as described below.

An Al layer serving as a metallic layer is applied to the organic semiconductor layer 24, which has already been created above the substrate 21 as shown in the cross-sectional diagram of FIG. 3A, in order to create the metallic or semiconductor layer 35 serving as the lower-side layer of the structure in a vacuum vapor-deposition process.

Then, a AZ1500 positive resist is applied to the metallic or semiconductor layer 35 in order to create the upper insulation layer 34 serving as the upper-side layer of the structure as shown in the cross-sectional diagram of FIG. 6.

Subsequently, the Al layer is etched by making use of an etching liquid in order to carry out a patterning process on the Al layer. At that time, a side etching process is carried out by controlling the etching time. As a result, the structure is created to have such an over hung shape that the Al layer used as the metallic or semiconductor layer 35 serving as the lower-side layer of the structure has wall surfaces on sides inner with respect to the wall surfaces of the upper insulation layer 34 serving as the upper-side layer of the structure as shown in the cross-sectional diagram of FIG. 6.

In accordance with the third embodiment described above, a structure having the over hung shape other than the upside-down taper shape is created as a stack of two layers on the organic semiconductor layer 24 which has already been created above the substrate 21 as shown in the cross-sectional diagram of FIG. 3A. The two layers of the stack are the metallic or semiconductor layer 35 serving as the structure lower-side layer having a small width and the upper insulation layer 34 serving as the structure upper-side layer having a large width. After the structure having the over hung shape has been created on the organic semiconductor layer 24 as described above, an electrode material is created on the upper insulation layer 34 serving as the upper-side layer of the structure to be cut by the outer edges of the upper insulation layer 34 to result in the source electrode 25 and the drain electrode 26 by aligning the positions of the inner ends of the source electrode 25 and the drain electrode 26 to the positions of their respective outer edges of the upper insulation layer 34 serving as the upper-side layer of the structure in the same way as the first embodiment.

Thus, much like the first and second embodiments described earlier, the channel length Lch matches the patterning resolution PR of the structure. As a result, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure even if the substrate 21 expands and/or another phenomenon occurs after the structure has been created.

In a modified version of the third embodiment, a thin insulation film is provided between the organic semiconductor layer 24 and the metallic or semiconductor layer 35. A stack of the thin insulation film and the metallic or semiconductor layer 35 forms the lower-side layer of a structure having the over hung shape.

The material used for making the thin insulation film in the configuration of the modified version of the third embodiment is an insulation film which can be solved in a water or fluorine series solvent. A typical example of the insulation film is the PVA which can be solved in a water solvent.

The structure according to the modified version of the third embodiment can be created by adoption of typically a manufacturing method described as follows.

In accordance with this manufacturing method, a thin insulation film is applied to the entire surface of the organic semiconductor layer 24, which has already been created above the substrate 21 as shown in the cross-sectional diagram of FIG. 3A, in order to create the lower-side layer of the structure in conjunction with a metallic or semiconductor layer 35 to be created later in a burning process. In this manufacturing method, the thin insulation film is a film which can be solved in a water or fluorine series solvent. A typical example of the insulation film is the PVA which can be solved in a water solvent.

Then, an Al layer serving as a metal layer to be used as the metallic or semiconductor layer 35 is created on the thin insulation film in a vacuum vapor-deposition process. The metallic or semiconductor layer 35 and the thin insulation film serve as the lower-side layer of the structure as described above.

Subsequently, an SU-8 resist is applied to the Al layer serving as a metal layer in order to create the upper insulation layer 34 serving as the upper-side layer of the structure in an exposure process.

Then, the Al layer is etched by making use of an etching liquid in order to carry out a patterning process on the Al layer. At that time, a side etching process is carried out by controlling the etching time. As a result, the structure is created to have such an over hung shape that the Al layer used as the metallic or semiconductor layer 35 serving as the lower-side layer of the structure in conjunction with the thin insulation film has wall surfaces on sides inner with respect to the wall surfaces of the upper insulation layer 34 serving as the upper-side layer of the structure as shown in the cross-sectional diagram of FIG. 6.

Subsequently, the thin insulation film on the outer side of the Al layer is dissolved in order to create a structure which has such an over hung shape that the thin insulation film serving as the lower-side layer of the structure in conjunction with the Al layer has wall surfaces on sides inner with respect to the wall surfaces of the upper insulation layer 34 serving as the upper-side layer of the structure as shown in the cross-sectional diagram of FIG. 6. That is to say, the resulting structure has such an over hung shape that the thin insulation film serving as the lower-side layer of the structure in conjunction with the Al layer used as the metallic or semiconductor layer 35 has a small width in comparison with the width of the upper insulation layer 34 serving as the upper-side layer of the structure as shown in the cross-sectional diagram of FIG. 6.

4: Fourth Embodiment of the Semiconductor Device

Figure 7:
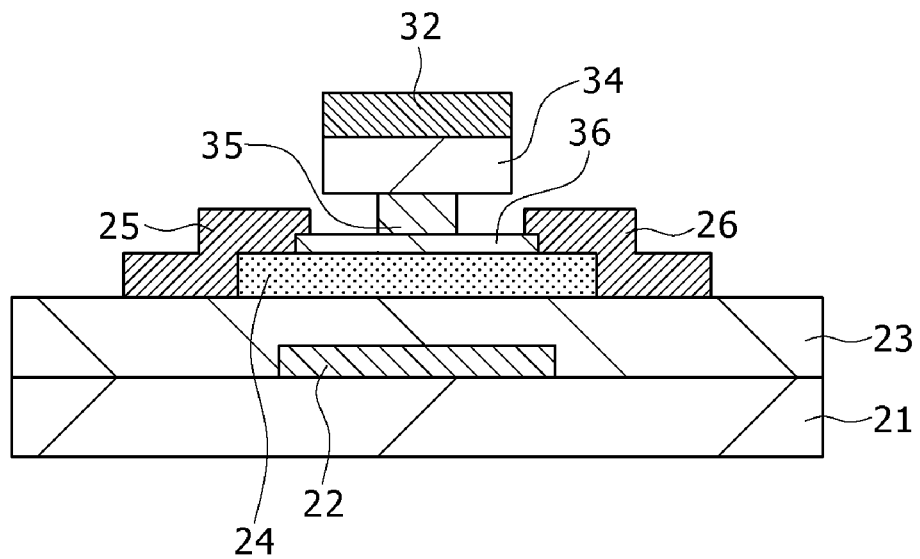
FIG. 7 is a cross-sectional diagram serving as a configuration diagram showing a rough configuration including necessary components employed in a semiconductor device according to a fourth embodiment of the present invention.

FIG. 7 is a cross-sectional diagram serving as a configuration diagram showing a rough configuration including necessary components employed in a semiconductor device according to a fourth embodiment of the present invention.

The fourth embodiment is obtained by creating an insulation film 36 between the metallic or semiconductor layer 35 serving as the small-width lower-side layer of the structure and the organic semiconductor layer 24 in the third embodiment.

In addition, the source electrode 25 and the drain electrode 26 are extended to cover the surfaces of their respective ends of the insulation film 36.

Since the other configurations included in the fourth embodiment are identical with their respective counterpart configurations included in the third embodiment, the other configurations are denoted by the same reference numerals as the counterpart configurations and the other configurations are not described in order to avoid duplications of explanations.

The material used for making the insulation film 36 is typically an insulation film that can be solved in a water or fluorine series solvent. A typical example of the insulation film solvable in a water or fluorine series solvent is the PVA (poly vinyl alcohol) which has been cited previously in the description of the modified version of the third embodiment.

The structure according to the fourth embodiment can be created typically as follows.

First of all, an insulation film 36 to serve as the bottom layer of a structure is applied to the entire surface of the organic semiconductor layer 24, which has already been created above the substrate 21 as shown in the cross-sectional diagram of FIG. 3A, in a burning process. The insulation film 36 is an insulation film which can be solved in a water or fluorine series solvent. A typical example of the insulation film is the PVA which can be solved in a water solvent.

Then, an Al layer is created on the insulation film 36 in a vacuum vapor-deposition process in order to form the metallic or semiconductor layer 35 serving as the lower-side layer of the structure.

Subsequently, an SU-8 resist is applied to the Al layer in order to create the upper insulation layer 34 serving as the upper-side layer of the structure in an exposure process.

Then, the Al layer is etched by making use of an etching liquid in order to carry out a patterning process on the Al layer. At that time, a side etching process is carried out by controlling the etching time. As a result, the structure is created to have such an over hung shape that the Al layer used as the metallic or semiconductor layer 35 serving as the lower-side layer of the structure has wall surfaces on sides inner with respect to the wall surfaces of the upper insulation layer 34 serving as the upper-side layer of the structure as shown in the cross-sectional diagram of FIG. 7.

Then, a pattern of the insulation film 36 serving as the bottom layer of the structure is used as a mask in order to carry out a patterning process on the insulation film 36 by adoption of an RIE (reactive ion etching) method.

Subsequently, by adoption of the vacuum vapor-deposition method or the sputtering method, an electrode material is created as a film in order to form electrode materials of inclined vapor-deposition components on the insulation film 36 which serves as the bottom layer of the structure. Thus, a source electrode 25 and a drain electrode 26 are created by superposing the source electrode 25 and the drain electrode 26 on the surfaces of their respective ends of the insulation film 36 which serves as the bottom layer of the structure.

It is to be noted that the structure according to the fourth embodiment can also be created by adoption of another manufacturing method.

For example, in accordance with the other manufacturing method, the insulation film 36 serving as the bottom layer of the structure is created by making use of an insulation film which can be solved in a fluorine series solvent. A typical example of the insulation film solvable in a fluorine series solvent is a perfect fluoride amalgam (solvent) which includes a $(C_6F_{10}O)_n$ amalgam (solvent) and $C_8$ as main components.

In accordance with the fourth embodiment described above, a structure having the over hung shape other than the upside-down taper shape is created as a stack of three layers on the organic semiconductor layer 24 which has already been created above the substrate 21 as shown in the cross-sectional diagram of FIG. 3A. The three layers of the stack are the insulation film 36 serving as the bottom layer of the structure, the metallic or semiconductor layer 35 serving as the structure lower-side layer having a small width and the upper insulation layer 34 serving as the structure upper-side layer having a large width. Then, an electrode material is created on the upper insulation layer 34 serving as the upper-side layer of the structure to be cut by the outer edges of the upper insulation layer 34 to result in the source electrode 25 and the drain electrode 26 by aligning the positions of the inner ends of the source electrode 25 and the drain electrode 26 to the positions of their respective outer edges of the upper insulation layer 34.

Thus, much like the first to third embodiments described previously, the channel length Lch matches the patterning resolution PR of the structure. As a result, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure even if the substrate 21 expands and/or another phenomenon occurs after the structure has been created.

In addition, as described above, the fourth embodiment is obtained by creating an insulation film 36 between the metallic or semiconductor layer 35 serving as the small-width lower-side layer of the structure and the organic semiconductor layer 24 in the third embodiment. In addition, the source electrode 25 and the drain electrode 26 are extended to cover the surfaces of their respective ends of the insulation film 36. Thus, as shown in the cross-sectional diagram of FIG. 7, the entire surface of the organic semiconductor layer 24 can be covered by making use of the insulation film 36, the source electrode 25 and the drain electrode 26. As a result, the fourth embodiment has a merit that the organic semiconductor layer 24 can be protected from being damaged.

It is to be noted that, since the cross-sectional diagram of FIG. 7 merely shows a cross section of the fourth embodiment, the figure does not clearly indicates whether or not other portions of the surface of the organic semiconductor layer 24 are covered by making use of the insulation film 36, the source electrode 25 and the drain electrode 26. In order to cover the entire surface of the organic semiconductor layer 24 by making use of the insulation film 36, the source electrode 25 and the drain electrode 26, it is necessary to create a top-view planar pattern aligned to the insulation film 36, the source electrode 25 and the drain electrode 26 as a pattern which is wider than the top-view planar pattern of the organic semiconductor layer 24.

5: Fifth Embodiment of the Semiconductor Device

Figure 8:
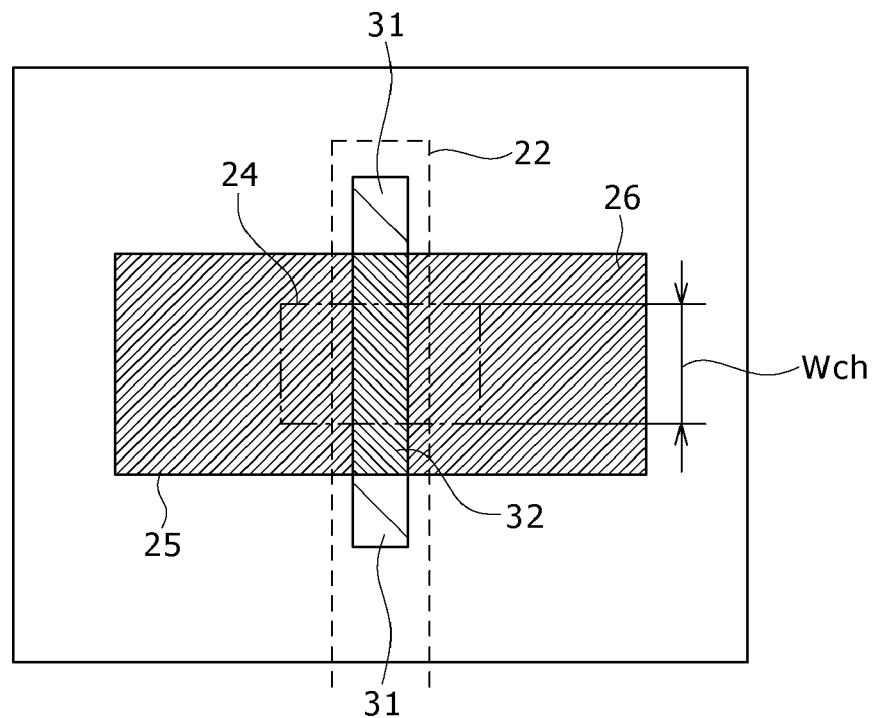
FIG. 8 is a top-view diagram serving as a configuration diagram showing a rough configuration including necessary components employed in a semiconductor device according to a fifth embodiment of the present invention.

FIG. 8 is a top-view diagram serving as a configuration diagram showing a rough configuration including necessary components employed in a semiconductor device according to a fifth embodiment of the present invention. In the same way as the top-view diagram of FIG. 2, some blocks are each shown as a hatched block in the top-view diagram of FIG. 8.

In the first to fourth embodiments described so far, the structure is created as a structure which has a top-view planar pattern with a width equal to or slightly smaller than the width of the gate electrode 22.

In the case of the fifth embodiment, on the other hand, the structure 31 is created as a structure which has a top-view planar pattern with a very small width in comparison the width of the gate electrode 22.

As shown in the top-view diagram of FIG. 8, the top-view planar pattern of the structure 31 is a vertical long pattern which has a very small width in comparison the width of the gate electrode 22. Thus, the channel length Lch can be reduced.

In addition, much like the modified version shown in the top-view diagram of FIG. 4 as the modified version of the first embodiment, the width of each of the source electrode 25, the drain electrode 26 and the electrode material layer 32 is made greater than the width of the organic semiconductor layer 24. Thus, the organic semiconductor layer 24 is covered by the structure 31, the source electrode 25 and the drain electrode 26. In the case of the fifth embodiment, the channel width Wch is equal to the width of the organic semiconductor layer 24.

To put it more concretely, for example, the dimensions of the top-view planar pattern of the organic semiconductor layer 24 are set at 100 μm×30 μm whereas the dimensions of the top-view planar pattern of the structure 31 are set at 5 μm×120 μm.

In accordance with the fifth embodiment described above, the structure 31 is created on the organic semiconductor layer 24 in such a way that the positions of the inner ends of the source electrode 25 and the drain electrode 26 are aligned to the positions of their respective outer edges of the structure 31.

Thus, much like the first to fourth embodiments described earlier, the channel length Lch matches the patterning resolution PR of the structure 31. As a result, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure 31 even if the substrate 21 expands and/or another phenomenon occurs after the structure 31 has been created.

On top of that, in the case of the fifth embodiment, the entire organic semiconductor layer 24 is covered by the structure 31, the source electrode 25 and the drain electrode 26. Thus, the fifth embodiment has a merit that the organic semiconductor layer 24 can be protected from being damaged.

6: Sixth Embodiment of the Semiconductor Device

Figure 9:
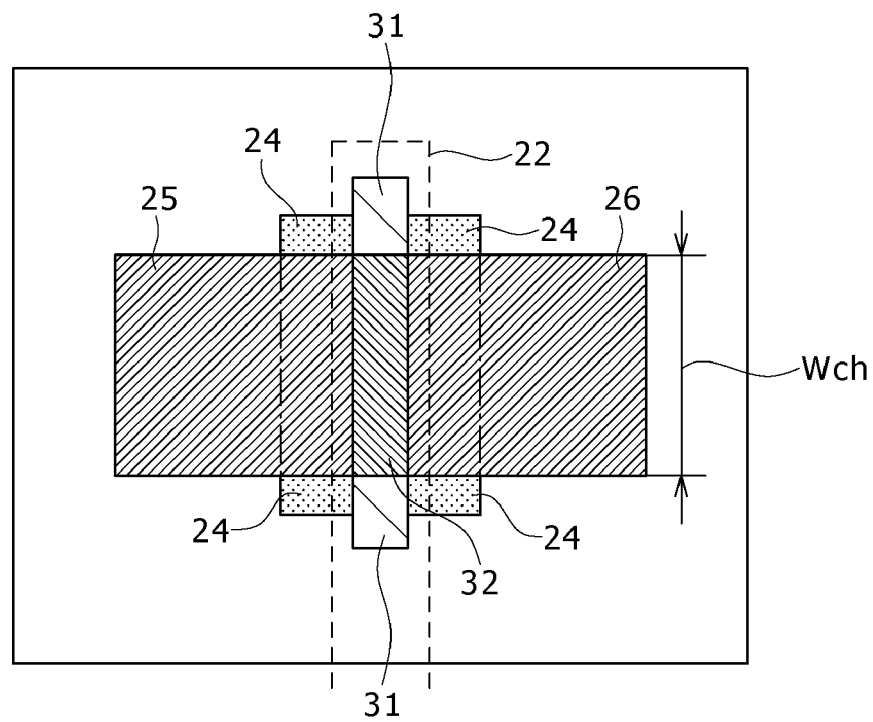
FIG. 9 is a top-view diagram serving as a configuration diagram showing a rough configuration including necessary components employed in a semiconductor device according to a sixth embodiment of the present invention.

FIG. 9 is a top-view diagram serving as a configuration diagram showing a rough configuration including necessary components employed in a semiconductor device according to a sixth embodiment of the present invention. In the same way as the top-view diagram of FIG. 2, some blocks are each shown as a hatched block in the top-view diagram of FIG. 9.

In the case of the sixth embodiment, the structure 31 is created as a structure which has a top-view planar pattern with a very small width in comparison the width of the gate electrode 22 as is the case with the fifth embodiment.

As shown in the top-view diagram of FIG. 9, the top-view planar pattern of the structure 31 is a vertical long pattern which has a very small width in comparison the width of the gate electrode 22. Thus, the channel length Lch can be reduced.

In addition, each of the source electrode 25, the drain electrode 26 and the electrode material layer 32 is created as an element having a top-view planar pattern with a large width. On top of that, the vertical length of the structure 31 is made slightly greater than the width of the organic semiconductor layer 24 whereas the width of each of the source electrode 25, the drain electrode 26 and the electrode material layer 32 is made slightly smaller than the width of the organic semiconductor layer 24. In the case of the sixth embodiment, the channel width Wch is equal to the width of each of the source electrode 25 and the drain electrode 26.

To put it more concretely, for example, the dimensions of the top-view planar pattern of the organic semiconductor layer 24 are set at 100 μm×100 μm whereas the dimensions of the top-view planar pattern of the structure 31 are set at 5 μm×110 μm. In this case, the width of each of the source electrode 25 and the drain electrode 26 can be set at 90 μm. Thus, the channel width Wch can also be set at 90 μm.

In accordance with the sixth embodiment described above, the structure 31 is created on the organic semiconductor layer 24 in such a way that the positions of the inner ends of the source electrode 25 and the drain electrode 26 are aligned to the positions of their respective outer edges of the structure 31.

Thus, much like the first to fifth embodiments described earlier, the channel length Lch matches the patterning resolution PR of the structure 31. As a result, it is no longer necessary to increase the design margin.

In addition, the source electrode 25 and the drain electrode 26 can be created by self aligning the positions of the inner ends of the source electrode 25 and the drain electrode 26 to the positions of their respective outer edges of the structure 31 even if the substrate 21 expands and/or another phenomenon occurs after the structure 31 has been created.

On top of that, in the case of the sixth embodiment, the channel width Wch is equal to the width of each of the source electrode 25 and the drain electrode 26 but smaller than the width of the organic semiconductor layer 24.

Thus, since a portion used as the channel of the organic thin-film transistor is not extended to the edges of the organic semiconductor layer 24, a parasitic transistor is hardly created.

The semiconductor device according to any one of the first to sixth embodiments described so far and the modified versions explained earlier as the modified versions of some of the embodiments can be used as a semiconductor device provided on the backplane of a display apparatus which is used for displaying images.

The display apparatus employing the semiconductor device can be typically manufactured as follows.

First of all, the semiconductor device employing an organic TFT is created by adoption of the device creation method which has been explained earlier in the descriptions of the first to sixth embodiments discussed so far and the modified versions enlightened earlier as the modified versions of some of the embodiments.

Then, a material typically provided with a photosensitivity characteristic to serve as a material for making an inter-layer insulation film is applied to the semiconductor device in order to create the inter-layer insulation film.

Subsequently, by adoption of the photolithography technology, penetration holes for connecting electrodes and wires are created through the inter-layer insulation film.

Then, a metallic film is created on the entire surface of the inter-layer insulation film, filling up the penetration holes. Subsequently, the creation processing is continued by carrying out a patterning process on the metallic film through adoption of the photolithography technology in order to connect electrodes/wires provided on an upper-side layer to electrodes/wires provided on a lower-side layer. A typical example of the electrode provided on the upper-side layer is a pixel electrode.

In this way, the backplane of a display apparatus can be manufactured.

7: Embodiment of the Display Apparatus According to the Invention

Figure 10:
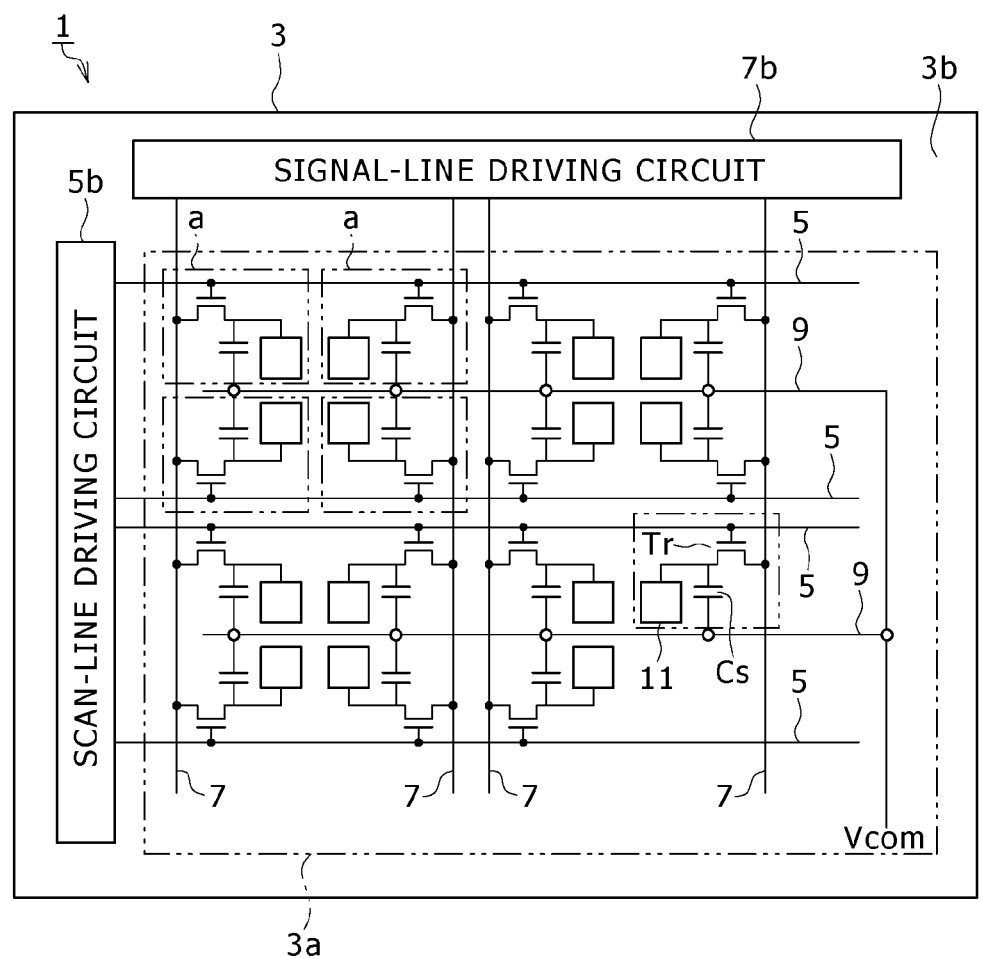
FIG. 10 is a diagram showing the configuration of a display apparatus according to an embodiment of the present invention.

FIG. 10 is a diagram showing the configuration of a display apparatus 1 according to an embodiment of the present invention.

Typical examples of the display apparatus 1 shown in the diagram of FIG. 10 are a liquid-crystal display apparatus and an electrical permanent display apparatus. The display apparatus 1 includes a substrate 3 on the driving side, a display area 3a and a peripheral area 3b which are set on the substrate 3.

In the display area 3a, a plurality of scan lines 5 are laid in the horizontal direction and a plurality of signal lines 7 are laid in the vertical direction. The display area 3a serves as a pixel array section including a plurality of pixels a which are each provided at the intersection of every scan line 5 and every signal line 7. In addition, each of the pixels a is connected to a common line 9 which is laid in a direction parallel to the scan lines 5.

In the peripheral area 3b, on the other hand, a scan-line driving circuit 5b and a signal-line driving circuit 7b are provided. The scan-line driving circuit 5b is a circuit for driving the scan lines 5 in order to carry out a scan operation. The signal-line driving circuit 7b is a circuit for supplying a video signal also referred to as an input signal to the signal lines 7. The video signal is a signal conveying luminance information.

Each of the pixels a has a pixel circuit which employs a thin-film transistor Tr serving as a switching device and a signal holding capacitor Cs. In addition, the pixel a also includes a pixel electrode 11 connected to a node included in the pixel circuit to serve as a node used for connecting the thin-film transistor Tr to the signal holding capacitor Cs.

It is to be noted that, as will be described later in detail by referring to cross-sectional diagrams and top-view diagrams, the pixel electrode 11 is created on an inter-layer insulation film which is used for covering the pixel circuit.

The thin-film transistor Tr is the organic TFT included in the semiconductor device according to the present invention. The gate electrode of the thin-film transistor Tr is connected to the scan line 5 whereas a specific one of the source and drain electrodes of the thin-film transistor Tr is connected to the signal line 7. On the other hand, the other one of the source and drain electrodes of the thin-film transistor Tr is connected to a specific one of the two nodes of the signal holding capacitor Cs and the pixel electrode 11. The other one of the two nodes of the signal holding capacitor Cs is connected to the common line 9. In the following description, the specific node of the signal holding capacitor Cs is also referred to as an upper-side node 7c of the signal holding capacitor Cs whereas the other node of the signal holding capacitor Cs is also referred to as a lower-side node 9c of the signal holding capacitor Cs It is to be noted that the common line 9 is connected to a common electrode provided on the other side of the substrate 3. However, the connection of the common line 9 connected to the common electrode provided on the other side of the substrate 3 is not shown in the diagram of FIG. 10.

In the configuration of the pixel a, the video signal appearing on the signal line 7 is supplied to the signal holding capacitor Cs by way of the thin-film transistor Tr put in a turned-on state by an active signal appearing on the scan line 5. The video signal is then stored in the signal holding capacitor Cs. Subsequently, a voltage representing the magnitude of the video signal stored in the signal holding capacitor Cs is supplied to the pixel electrode 11.

In the circuit configuration described above, the pixel circuits of the pixels a are laid out symmetrically with respect to the scan lines 5. To put it in detail, the pixel circuits of the pixels a are laid out symmetrically with respect to a direction parallel to the scan lines 5.

In addition, the pixel circuits of the pixels a are laid out symmetrically also with respect to the signal lines 7. To put it in detail, the pixel circuits of the pixels a are laid out symmetrically with respect to a direction parallel to the signal lines 7.

Thus, a connection point connecting the pixel electrode 11 of the pixel a to the pixel circuit of the same pixel a is located at a position in the middle between pixels a adjacent in the extension direction of the scan line 5 and the position in the middle between pixels a adjacent in the extension direction of the scan line 5 is also a position in the middle between pixels a adjacent in the extension direction of the signal line 7.

In addition, in the circuit configuration described above, two adjacent pixels a sandwiched between two adjacent scan lines 5 share a common line 9 so that the number of common lines 9 is half the number of common lines 9 in the existing circuit configuration.

It is to be noted that the size and position of the layout of the pixel circuits can be changed to any other layout as long as the connection point connecting the pixel electrode 11 of the pixel a to the pixel circuit of the same pixel a is located at a position in the middle between pixels a and, in addition, each member of the pixels a are located symmetrically with respect to the scan line 5 and the signal line 7. The members of a pixel a include an electrode and a node which are located in the pixel a.

The configuration described above as the configuration of a pixel circuit is no more than a typical configuration. That is to say, if necessary, the pixel circuit can be configured to include another capacitive element or a plurality of transistors. In addition, in accordance with a change of the pixel circuit, a driving circuit required for the change of the pixel circuit may be added to the peripheral area 3b.

Figure 11:
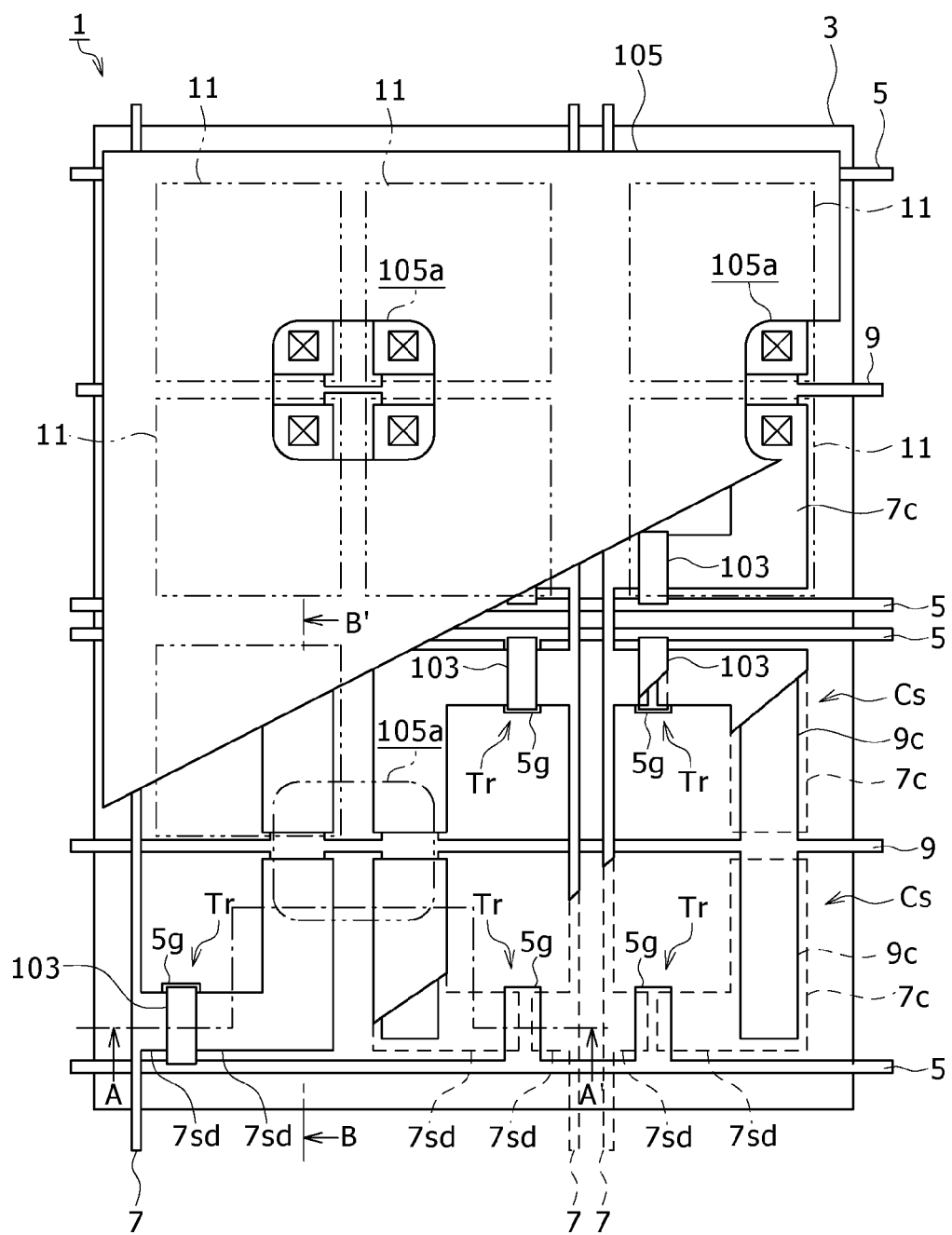
FIG. 11 is a top-view diagram showing sections employed in the display apparatus shown in the diagram of FIG. 10.

Next, FIG. 11 is given to serve as a top-view diagram showing sections employed in the display apparatus 1 implemented by the embodiment of the present invention as shown in the diagram of FIG. 10. On the other hand, FIG. 12 is a plurality of cross-sectional diagrams each showing the display apparatus 1 shown in the top-view diagram of FIG. 11. To be more specific, FIG. 12A is a cross-sectional diagram showing a cross section A-A' shown in the top-view diagram of FIG. 11 whereas FIG. 12B is a cross-sectional diagram showing a cross section B-B' shown in the top-view diagram of FIG. 11.

Figure 12A:
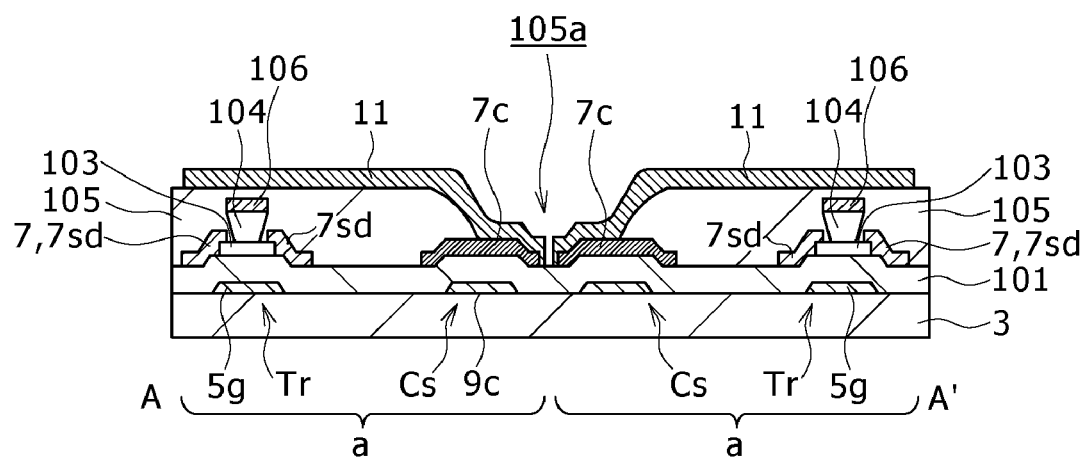
FIG. 12A is a cross-sectional diagram showing a cross section A-A' shown in the top-view diagram of FIG. 11.
Figure 12B:
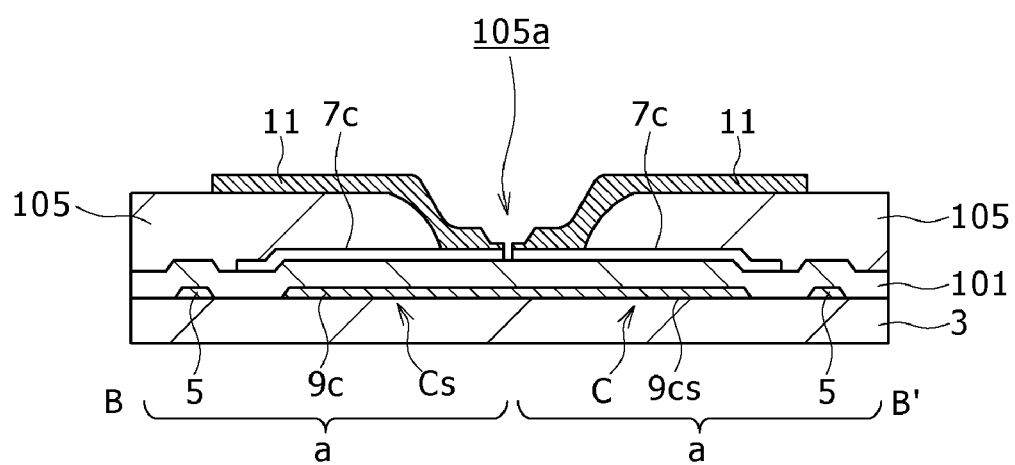
FIG. 12B is a cross-sectional diagram showing a cross section B-B' shown in the top-view diagram of FIG. 11.

A layer configuration of the display apparatus 1 is explained hereafter by referring to the top-view diagram of FIG. 11 as well as the cross-sectional diagrams of FIGS. 12A and 12B. It is to be noted that, as an example, a pixel a of 150 dpi is assumed. The following description explains a layer configuration in a layout in which the pixel a has an angle of about 170 μm.

As shown in the top-view diagram of FIG. 11 as well as the cross-sectional diagrams of FIGS. 12A and 12B, in the first layer on the substrate 3 provided on the driving side, scan lines 5 and common lines 9 are provided in parallel to each other. A common line 9 is laid between two adjacent scan lines 5 to form a set of three lines which are the common line 9 and the two adjacent scan lines 5.

In every pixel a, the gate electrode 5g of the thin-film transistor Tr is extended from the scan line 5 in a direction toward the common line 9.

In addition, in every pixel a, the lower-side node 9c of the signal holding capacitor Cs is extended from the common line 9 in two directions toward the scan lines 5 provided on respectively the two sides of the common line 9. That is to say, the lower-side node 9c of the signal holding capacitor Cs is extended from the common line 9 in two directions toward respectively the two pixels a on the two sides of the common line 9.

On top of that, a gate insulation film 101 shown only in the cross-sectional diagrams of FIGS. 12A and 12B is provided to cover the scan line 5 and the common line 9.

In a second layer on the gate insulation film 101, the signal line 7, the source and drain electrodes 7sd of the thin-film transistor Tr and the upper-side node 7c of the signal holding capacitor Cs are provided.

In every pixel a, a specific one of the source and drain electrodes 7sd of the thin-film transistor Tr is extended from the signal line 7.

In addition, the other one of the source and drain electrodes 7sd of the thin-film transistor Tr and the upper-side node 7c of the signal holding capacitor Cs are created as a continuous pattern in every pixel a.

As described above, the specific one of the source and drain electrodes 7sd of the thin-film transistor Tr is extended from the signal line 7. Here, the specific one of the source and drain electrodes 7sd of the thin-film transistor Tr is extended to the inner sides of the two signal lines 7.

As described above, the other one of the source and drain electrodes 7sd of the thin-film transistor Tr and the upper-side node 7c of the signal holding capacitor Cs are created as a continuous pattern. Here, the other one of the source and drain electrodes 7sd of the thin-film transistor Tr is wired to the center of four pixels a sharing the common line 9 at a location sandwiched by two signal lines 7. The continuous pattern formed by the other one of the source and drain electrodes 7sd of the thin-film transistor Tr and the upper-side node 7c of the signal holding capacitor Cs serves as a portion for connecting the other one of the source and drain electrodes 7sd of the thin-film transistor Tr and the upper-side node 7c of the signal holding capacitor Cs to the pixel electrode 11 to be described below.

As described above, in this embodiment, the continuous pattern formed by the other one of the source and drain electrodes 7sd of the thin-film transistor Tr and the upper-side node 7c of the signal holding capacitor Cs serves as a portion for connecting the other one of the source and drain electrodes 7sd of the thin-film transistor Tr and the upper-side node 7c of the signal holding capacitor Cs to the pixel electrode 11. This embodiment is configured to provide the continuous pattern at the center of the four pixels cited above.

In addition, between the source and drain electrodes 7sd of the thin-film transistor Tr in every pixel a, an organic semiconductor layer 103 to be used as an active area of the thin-film transistor Tr is provided at a location at which a stack is to be formed by the organic semiconductor layer 103 in conjunction with the gate electrode 5g of the thin-film transistor Tr. That is to say, the source and drain electrodes 7sd of the thin-film transistor Tr have been created over the surfaces of respectively the left and right ends of the organic semiconductor layer 103. The active area of the thin-film transistor Tr corresponds to the source, channel and drain areas which are cited earlier.

On top of that, in every pixel a, a structure 104 having an upside-down taper shape is created on the organic semiconductor layer 103 and, on the structure 104, an electrode material layer 106 is created from the same material as a material used for making the source and drain electrodes 7sd of the thin-film transistor Tr. That is to say, the thin-film transistor Tr employed in the display apparatus 1 has a configuration which is identical with the semiconductor device implemented by the first embodiment of the present invention as explained before.

Then, an inter-layer insulation film 105 is created to cover the pixel circuit which includes such a thin-film transistor Tr and the signal holding capacitor Cs.

It is desirable to make the inter-layer insulation film 105 from such a thick film that no parasitic capacitor is formed between the pixel circuit and the pixel electrode 11 created over the pixel circuit and to create the inter-layer insulation film 105 having a flat surface.

Here, in particular, a plurality of connection holes 105a spread over four pixels a are created on the inter-layer insulation film 105. At the bottom of each of the connection holes 105a, as a portion of a plurality of pixel circuits adjacent to each other, four upper nodes 7c located at the center of the four pixels a are each put in a state of being exposed as explained before. That is to say, inside one connection hole 105a, the four upper nodes 7c each included in one of the four pixel circuits of the four pixels a are each put in a state of being exposed.

It is nice to set the size of each of the connection holes 105a at a value in such a range that connection to the four upper nodes 7c is sufficiently provided. If the pixel aperture is taken into consideration, it is desirable to provide as a small aperture area as possible. That is to say, it is desirable to provide as a small aperture shape as possible. For example, in a layout assuming that the pixel a has an angle of about 170 µm, it is nice to create each of the connection holes 105a at an aperture diameter in the range 110 µm to 130 µm.

Then, in a third layer on the inter-layer insulation film 105, pixel electrodes 11 are created to form an array. At the bottom of the connection hole 105a provided on the inter-layer insulation film 105, the pixel electrode 11 is connected to the upper-side node 7c of the signal holding capacitor Cs included in the pixel circuit on a 1-to-1 basis. Thus, inside one connection hole 105a, the ends of four pixel electrodes 11 are put in a state of being connected directly to the tops of the upper nodes 7c.

Since a gate insulation film 101 is provided between the upper-side node 7c and the common line 9, the insulation between the pixel electrode 11 and the common line 9 is assured.

It is to be noted that, if the display apparatus 1 is to be used as a liquid-crystal display apparatus for example, the pixel electrodes 11 are covered by making use of an orientation film which is shown in none of the top-view diagram of FIG. 11 as well as the cross-sectional diagrams of FIGS. 12A and 12B.

Then, on the side of a surface for creating the pixel electrodes 11 on the substrate 3 provided on the driving side, a substrate facing substrate is provided. It is to be noted that the substrate facing substrate itself is shown in none of the top-view diagram of FIG. 11 as well as the cross-sectional diagrams of FIGS. 12A and 12B. On a surface facing the pixel electrodes 11 on the substrate facing substrate, a common electrode shared by all pixels a is provided.

In addition, if the display apparatus 1 is to be used as a liquid-crystal display apparatus for example, an orientation film covering the common electrode is provided. Furthermore, between two substrates provided for the pixel electrodes 11 and the common electrode respectively, a liquid-crystal layer such as a polymer dispersion type crystal layer is sandwiched and held through the orientation film.

If the display apparatus 1 is to be used as an electrical permanent display apparatus, on the other hand, between the two substrates provided for the pixel electrodes 11 and the common electrode respectively, a microcapsule is sandwiched and held. This microcapsule is a microcapsule throughout which graphite fine particles electrostatically charged in silicon ions and titanic oxide fine particles are dispersed.

The display apparatus 1 according to the embodiment can be manufactured typically as follows.

First of all, a substrate 3 on the driving side is prepared.

As the substrate 3, it is possible to make use of a plastic substrate which is made from the PES (poly ether sulfone).

In the case of a plastic substrate, any other kind of plastic can be used as a material for making the substrate. The other kind of plastic is typically the PEN (polyethylene naphthalate), the PI (polyimide), the PC (polycarbonate), the PAR (polyacrylate), the PEEK (polyether ether ketone), the PPS (polyphenylene sulfide) or the PET (polyethylene terephthalate).

In addition, a glass foil or a metallic foil can be used as the substrate 3.

Then, in order to create a pattern of wires of the first layer on the substrate 3, a patterning process is carried out. The wires include the scan line 5, the gate electrode 5g extended from the scan line 5 to serve as the gate electrode 5g of the thin-film transistor Tr, the common line 9 and the lower-side node 9c obtained by extension from the common line 9 to serve as the lower-side node 9c of the signal holding capacitor Cs.

In accordance with the dye coat method for example, silver ink is applied to the upper surface of the substrate 3. Then, a thermal process is carried out at a temperature of 150° C. in order to create a conductive film with a thickness of 50 nm from the silver.

Subsequently, by adoption of the screen printing method, a pattern of resist ink is created on the conductive film.

Then, the printed pattern of resist ink is used as a mask in execution of a wet etching process performed by making use of a silver etching liquid in order to carry out a patterning process on the conductive film. As a result, the aforementioned pattern of wires of the first layer is created.

It is to be noted that, as a method for creating the pattern of resist ink to be used as the etching mask, an ink jet method, a photolithography method or a laser rendering method can be adopted. In addition, a direct patterning process can be carried out by adoption of the ink jet method, a screen printing method, a micro-contact printing method or an offset printing method. In order to assure good insulation between the aforementioned pattern of wires of the first layer and an upper-side layer to be created thereafter to serve as a layer of other wires and electrodes, however, it is desirable to create a gate electrode 5g having a flat surface as another surface with as small a film thickness as possible such as a thickness not greater than 100 nm.

In addition, as a material used for making the wires of the first layer, a material other than silver can be utilized. Typical examples of the material other than silver are metals such as gold, platinum, palladium, copper, nickel and aluminum. Another typical example of the material other than silver is a conductive organic material. Typical examples of the conductive organic material are the poly (3,4-ethylene dioxythiophene)/poly(4-stelenesulfonate) [PEDOT/PSS] and the PANI (poly-aniline).

Then, a gate insulation film 101 is created to cover the wires of the first layer.

By adoption of the dye coat method for example, a cross-linkable high-polymer material called a PVP (polyvinyl phenol) is applied to the wires of the first layer and a thermal process is carried out at a temperature of 150° C. in order to create the gate insulation film 101.

Since the thin-film transistor Tr operates at a low voltage, it is desirable to create the gate insulation film 101 as a film having a thickness not greater than 1 µm and a flat surface.

In addition to the dye coat method cited above, methods for creating such gate insulation film 101 include a gravure coat method, a roll coat method, a kiss coat method, a knife coat method, a slit coat method, a blade coat method, a spin coat method and an ink jet method.

In addition, besides the PVP mentioned above, materials usable for making the gate insulation film 101 include polyimide, polyamide, polyester, polyacrylate, polyvinyl alcohol, epoxy resin and novolac resin.

Then, an organic semiconductor layer 103 is created on the gate insulation film 101 at a location at which a stack is to be formed by the organic semiconductor layer 103 in conjunction with the gate electrode 5g of the thin-film transistor Tr.

Subsequently, at the center of the organic semiconductor layer 103, a structure 104 having an upside-down taper shape is created from an insulation material.

Then, after an electrode material layer has been created, a patterning process is carried out on the electrode material layer. As a result, an electrode material layer 106 is created on the structure 104. In addition, as wires of a second layer, a pattern of the signal line 7, the source and drain electrodes 7sd of the thin-film transistor Tr and the upper-side node 7c of the signal holding capacitor Cs is also created as well.

These components (that is, the organic semiconductor layer 103, the structure 104, the electrode material layer 106 and the wires of the second layer) can each be created by adoption of the same manufacturing method as the semiconductor device according to the first embodiment described earlier.

Then, an inter-layer insulation film 105 is created to cover the organic semiconductor layer 103, the structure 104, the electrode material layer 106 and the wires of the second layer.

By adoption of the screen printing method for example, a patterning process is carried out in order to create an inter-layer insulation film 105 which has a shape provided with a connection hole 105a in advance. As shown in the top-view diagram of FIG. 11, if a pixel a of 150 dpi is assumed and the pixel a has an angle of 170 μm, first of all, a resin paste made from polyimide is printed by making use of a screen version having an emulsion pattern with an angle of 150 μm. At that time, the resin paste is printed in such a way that the emulsion pattern covers the upper-side node 7c located at the center of the four pixels a.

Then, a burning process is carried out at a temperature of 120° C. on the resin paste.

As a result, an inter-layer insulation film 105 having a connection hole 105a spread over the four pixels a is created in a printing process and, in addition, the upper-side node 7c located at the center of the four pixels a is exposed to the bottom of the connection hole 105a.

It is to be noted that, if the emulsion pattern has an angle of 150 μm, the viscosity of the printed resin paste decreases at the burning time and, as a result, the emulsion pattern droops on the substrate 3. Thus, the connection hole 105a is created as a pattern at an aperture diameter reduced to an angle in the range 110 μm to 130 μm.

In addition, if a high-resolution mesh such as a mesh of number 640 or 840 is used in the printing process, it is possible to assure the reliability of the repeated printing process and, on top of that, it is possible to reduce the size of the emulsion pattern. It is thus possible to create a connection hole 105a with an aperture diameter having an angle of about 100 μm and to make a display backplane serving as the driving substrate of the display apparatus 1 with a high definition of at least 200 dpi.

As the resin paste used in the printing process, in addition to the one described above, it is also possible to make use of the epoxy resin, the polyester resin, the phenol resin, the urethane resin, the acryl resin or another kind of resin.

In the case of a thin-film transistor Tr having a bottom gate structure, however, the inter-layer insulation film 105 is created on the organic semiconductor layer 103. It is thus desirable to select a resin material which does not deteriorate the characteristic of the thin-film transistor Tr due to a solvent included in the resin paste or due to the thermal process carried out on the resin material.

It is to be noted that the method adopted for creation of the inter-layer insulation film 105 does not have to be the screen printing method. That is to say, a method other than the screen printing method can also be adopted for creation of the inter-layer insulation film 105. Typical examples of the method other than the screen printing method are the ink jet method mentioned before and a dispenser method.

Then, on the inter-layer insulation film 105, a pattern of pixel electrodes 11 is created in such a way that the pixel electrodes 11 are independently connected to the upper nodes 7c of the signal holding capacitors Cs at the bottom of the connection holes 105a.

In accordance with the screen printing method making use of the conductive paste for example, a pattern creation process is carried out in order to create pixel electrodes 11. As the conductive paste, for example, it is possible to make use of a silver paste such as a silver paste which is made by Fujikura Kasei Corporation as a silver paste with a model name of XA-9024. After the screen printing process has been carried out, a thermal process is executed at a temperature of 150° C. It is to be noted that, in this case, a pixel electrode 11 is created inside the connection hole 105a by carrying out a patterning process. Thus, the connection hole 105a is rarely blocked by the pixel electrode 11. As a result, since air is left inside the connection hole 105a, it is possible to avoid bad connections with the pixel circuit after a thermal hardening process. For details, the reader is advised to refer to Japanese Patent Laid-open No. 2001-274547.

As a conductive paste used for creating a pixel electrode 11, a paste other than the silver paste can be used. Typical examples of the paste other than the silver paste are the gold paste, the platinum paste, the palladium paste, the copper paste, the nickel paste and a paste of an alloy material which is obtained by mixing gold, platinum, palladium, copper and/or nickel.

In addition, as a method for creating a pixel electrode 11, a method other than the screen printing method can also be adopted. For example, a pixel electrode 11 can be created in a direct patterning process which is carried out by adoption of an ink jet method, a screen printing method, a micro-contact printing method or an offset printing method.

On top of that, as a material used for making the pixel electrode 11, a metal or a conductive organic material can be selected in accordance with the method adopted for creating a pixel electrode 11. Typical examples of the conductive organic material are the poly(3,4-ethylene dioxythiophene)/poly(4-stelenesulfonate) [PEDOT/PSS] and the PANI (polyaniline).

Then, if the display apparatus 1 is to be used as a liquid-crystal display apparatus, an orientation film covering the pixel electrodes 11 is created in order to complete the process of creating the driving substrate. Subsequently, a liquid-crystal layer is created, being sandwiched and held between the driving substrate and a driving-substrate facing substrate in order to complete the process of creating the display apparatus 1. The driving-substrate facing substrate is created on the common electrode as an orientation film for covering the common electrode.

If the display apparatus 1 is to be used as an electrical permanent display apparatus, on the other hand, between the two substrates (that is, the driving substrate provided for the creation of the pixel electrodes 11 and the driving-substrate facing substrate provided for the creation of the common electrode respectively), a microcapsule is sandwiched and held in order to complete the process of creating the display apparatus 1. This microcapsule is a microcapsule in which graphite fine particles electrostatically charged in silicon ions and titanic oxide fine particles are dispersed.

In accordance with the display apparatus 1 implemented by the embodiment described above as an embodiment of the present invention, the organic TFT serving as the thin-film transistor Tr has the same configuration as the TFT employed in the semiconductor device according to the first embodiment of the present invention. Thus, the source and drain electrodes 7sd can be created by aligning the positions of the inner ends of the source and drain electrodes 7sd to the positions of their respective outer edges of the structure 104.

As a result, the channel length Lch of the thin-film transistor Tr matches the patterning resolution PR of the structure 104 and it is therefore no longer necessary to increase the design margin.

In addition, the source and drain electrodes 7sd can be created by self aligning the positions of the inner ends of the source and drain electrodes 7sd to the positions of their respective outer edges of the structure 104 even if the substrate 3 expands and/or another phenomenon occurs after the structure 104 has been created.

Thus, the thin-film transistor Tr employed in the display apparatus 1 can be created to have a channel length Lch determined in advance with a high degree of precision. As a result, it is possible to enhance the performance of the display apparatus 1 and to increase the manufacturing yield of the thin-film transistor Tr employed in the display apparatus 1.

In addition, it is possible to reduce the design margin and, thus, decrease the pixel size so that the number of pixels a employed in the display apparatus 1 can be reduced.

In the embodiment implementing the display apparatus 1 provided by the present invention as described above, the organic TFT serving as the thin-film transistor Tr has the same configuration as the TFT employed in the semiconductor device according to the first embodiment of the present invention.

The display apparatus 1 provided by the present invention allows the adoption of the same configuration as the semiconductor device according to any one of the first to sixth embodiments of the present invention or the same configuration as the semiconductor device according to the modified versions of some of the embodiments. As an alternative, the display apparatus 1 provided by the present invention can be designed into any other configuration as long as the other configuration allows the use of a semiconductor device which falls into a range of the semiconductor devices according to the present invention.

In addition, the scope of the display apparatus 1 provided by the present invention is by no means limited to the configurations shown in the diagrams of FIGS. 10 to 12 as the configurations of the embodiment which implements the display apparatus 1. That is to say, the display apparatus 1 provided by the present invention can be implemented as any other display apparatus as long as the other display apparatus includes organic TFTs which each serve as the thin-film transistor Tr described above. For example, the embodiment shown in the diagrams of FIGS. 10 to 12 implements a display apparatus 1 in which the semiconductor device provided by the present invention is applied to a circuit employed in the display apparatus 1 and the display apparatus 1 is driven by adoption of an active matrix technique. It is to be noted, however, that the present invention may also be applied to a display apparatus which is different from the display apparatus 1.

On top of that, the semiconductor device provided by the present invention can be used in not only a display apparatus, but also integrated circuits for applications such as sensor and RFID tag applications.

The present application contains subject matter related to that disclosed in Japanese Priority Patent Application JP 2009-254088 filed in the Japan Patent Office on Nov. 5, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor device including a thin-film transistor, said semiconductor device comprising:
    a gate electrode of said thin-film transistor;
    a gate insulation film covering said gate electrode;
    an organic semiconductor layer created on said gate insulation film that serves as a layer including source, channel and drain areas of said thin-film transistor;
    a structure created on said organic semiconductor layer;
    a source electrode extending from a first upper surface portion of said gate insulation film and ending at first upper surface portion of said organic semiconductor layer, which exists at a location outside said structure to serve as a first specific upper surface portion of said organic semiconductor layer;
    a drain electrode extending from a second upper surface portion of said gate insulation film and ending at a second upper surface portion of said organic semiconductor layer, which exists at a location outside said structure to serve as a second specific upper surface of said organic semiconductor layer; and
    an electrode material layer on said structure and made of the same material as said source electrode and said drain electrode.

2. The semiconductor device according to claim 1 wherein:
    said structure has an over hung shape which has a surface on the side of said organic semiconductor layer and a surface on the side of said electrode material layer; and
    the area of said surface on the side of said organic semiconductor layer is smaller than the area of said surface on the side of said electrode material layer.

3. The semiconductor device according to claim 2 wherein said structure has an over hung shape having an upside-down taper form with inclined side-wall surfaces.

4. The semiconductor device according to claim 2 wherein:
    said structure has an over hung shape created as a stack having a plurality of layers including a lower layer and an upper layer; and
    said lower layer has side walls positioned on sides which are inner than sides on which side walls of said upper layer are positioned.

5. The semiconductor device according to claim 4 wherein each of said layers forming said stack of said structure is made from an insulation material.

6. The semiconductor device according to claim 4 wherein, of said layers forming said stack of said structure, said lower layer is made from a metal or a semiconductor whereas said upper layer is made from an insulation layer.

7. The semiconductor device according to claim 6 comprising an insulation film between said organic semiconductor layer and said lower layer of said structure.

8. The semiconductor device according to claim 7 wherein said source and drain electrodes extend to upper surfaces of ends of said insulation film.

9. The semiconductor device according to claim 1 wherein said organic semiconductor layer is entirely covered by said structure, said source electrode and said drain electrode.

10. A display apparatus comprising
a semiconductor device including a thin-film transistor,
a backplane including said semiconductor device, and
a display panel for displaying an image,
wherein said semiconductor device specifically comprises:
   a gate electrode of said thin-film transistor;
   a gate insulation film covering said gate electrode;
   an organic semiconductor layer created on said gate insulation film that serves as a layer including source, channel and drain areas of said thin-film transistor;
   a structure created on said organic semiconductor layer;
   a source electrode extending from a first upper surface portion of said gate insulation film and ending at first upper surface portion of said organic semiconductor layer, which exists at a location outside said structure to serve as a first specific upper surface portion of said organic semiconductor layer;
   a drain electrode extending from a second upper surface portion of said gate insulation film and ending at a second upper surface portion of said organic semiconductor layer, which exists at a location outside said structure to serve as a second specific upper surface of said organic semiconductor layer; and
   an electrode material layer on said structure and made of the same material as said source electrode and said drain electrode.

* * * * *